US012805268B2

(12) United States Patent
Miwa et al.

(10) Patent No.: US 12,805,268 B2
(45) Date of Patent: Nov. 17, 2026

(54) SEMICONDUCTOR WAFER CONFIGURED FOR SINGLE TOUCH-DOWN TESTING

(71) Applicant: Sandisk Technologies, Inc., Milpitas, CA (US)

(72) Inventors: Toru Miwa, Yokohama (JP); Takashi Murai, Yokohama (JP); Hiroyuki Ogawa, Nagoya (JP); Nisha Padattil Kuliyampattil, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 406 days.

(21) Appl. No.: 18/221,803

(22) Filed: Jul. 13, 2023

(65) Prior Publication Data

US 2024/0128132 A1 Apr. 18, 2024

Related U.S. Application Data

(60) Provisional application No. 63/415,927, filed on Oct. 13, 2022.

(51) Int. Cl.

| | |
|---|---|
| ***G01R 31/02*** | (2006.01) |
| ***G01R 1/073*** | (2006.01) |
| ***G01R 31/3185*** | (2006.01) |
| ***H01L 21/00*** | (2006.01) |
| ***H10P 74/00*** | (2026.01) |
| *H10B 80/00* | (2023.01) |
| *H10W 72/00* | (2026.01) |

(Continued)

(52) U.S. Cl.

CPC ........ *H10P 74/273* (2026.01); *G01R 1/07342* (2013.01); *H10B 80/00* (2023.02); *H10W 72/07554* (2026.01); *H10W 72/5445* (2026.01); *H10W 72/5453* (2026.01); *H10W 72/547* (2026.01); *H10W 72/5473* (2026.01); *H10W 72/932* (2026.01); *H10W 72/9445* (2026.01); *H10W 90/00* (2026.01); *H10W 90/24* (2026.01); *H10W 90/752* (2026.01); *H10W 90/754* (2026.01)

(58) Field of Classification Search

CPC ........ G01R 31/318511; G01R 31/2884; G01R 1/07342; H01L 22/34; H01L 2225/06506

See application file for complete search history.

(56) References Cited

U.S. PATENT DOCUMENTS 4,288,911 A 9/1981 Ports
4,749,947 A 6/1988 Gheewala (Continued)

FOREIGN PATENT DOCUMENTS

CN 1249534 4/2000

OTHER PUBLICATIONS

Notice of Allowance and Fee(s) Due dated Feb. 11, 2025 in U.S. Appl. No. 18/221,824.

(Continued)

*Primary Examiner* — Nicholas J Tobergte
*Assistant Examiner* — David J Goodwin
(74) *Attorney, Agent, or Firm* — Pearl Cohen LLP

(57) ABSTRACT

A semiconductor wafer includes pairs of semiconductor dies having test pads which are electrically coupled to each other to enable testing of pairs of semiconductor dies together at the same time. In this way, even wafers having large numbers of semiconductor dies can be tested with a semiconductor test assembly in a single touch-down test process.

11 Claims, 16 Drawing Sheets

(51) Int. Cl.

| | |
|---|---|
| *H10W 72/50* | (2026.01) |
| *H10W 72/90* | (2026.01) |
| *H10W 90/00* | (2026.01) |
| *H10W 90/24* | (2026.01) |

(56) References Cited

U.S. PATENT DOCUMENTS

| | | | | |
|---|---|---|---|---|
| 5,442,282 | A | 8/1995 | Rostoker et al. | |
| 6,351,836 | B1 | 2/2002 | Tsujii | |
| 7,131,033 | B1 * | 10/2006 | Roper | G01R 31/318561 365/174 |
| 8,817,511 | B2 | 8/2014 | McCarthy et al. | |
| 10,180,456 | B2 | 1/2019 | Pagani | |
| 11,054,461 | B1 | 7/2021 | Chong et al. | |
| 2005/0099201 | A1 | 5/2005 | Ferreira et al. | |
| 2005/0110511 | A1 * | 5/2005 | Gabara | G01R 31/2884 324/754.03 |
| 2007/0046314 | A1 * | 3/2007 | Chao | H01L 21/78 257/E21.599 |
| 2007/0241766 | A1 | 10/2007 | Kamitai et al. | |
| 2012/0013359 | A1 | 1/2012 | Shao | |
| 2020/0212009 | A1 | 7/2020 | Xu et al. | |
| 2023/0280372 | A1 | 9/2023 | Blin et al. | |

OTHER PUBLICATIONS

Office Action dated Sep. 30, 2025 in U.S. Appl. No. 18/221,797.
Office Action dated May 4, 2026 in U.S. Appl. No. 18/221,797.

* cited by examiner

SEMICONDUCTOR WAFER CONFIGURED FOR SINGLE TOUCH-DOWN TESTING

CLAIM OF PRIORITY

The present application claims priority from U.S. Provisional Patent Application No. 63/415,927, entitled "SEMICONDUCTOR WAFER CONFIGURED FOR SINGLE TOUCH-DOWN TESTING," filed Oct. 13, 2022, which is incorporated by reference herein in its entirety.

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and SSDs (Solid State Drives).

Semiconductor memory may be provided within a semiconductor package, which protects the semiconductor memory and enables communication between the memory and a host device. Examples of semiconductor packages include system-in-a-package (SiP) or multichip modules (MCM), where a plurality of dies are mounted and interconnected on a small footprint substrate. Semiconductor dies are typically batch processed together in a semiconductor wafer. Once the integrated circuits have been defined on the individual dies, the dies are diced from the wafer and removed for mounting within a package.

In order to identify faulty semiconductor dies before they are mounted within a semiconductor package, it is known to test semiconductor dies after formation while still part of the wafer. Conventional semiconductor test equipment has test heads matching a configuration of the dies on the wafer. The test heads are attached to a probe card having pins which provide electrical signals to each die on wafer. The probe cards measure output signals of each die and the test equipment compares output signals against expected values for the purpose of testing if each die operates as specified in its design specifications.

A current problem with semiconductor test equipment is that the number of dies on a wafer has increased to the point where they outnumber the test heads on the test equipment. The result is that conventional test operations require two touch-downs to test all dies on a wafer. A first set of dies is tested in a first touch-down, the wafer or test equipment is shifted and then the second set of dies is tested in a second touch-down. Requiring two touch-downs doubles the time it takes to perform semiconductor test operations and adds cost and inefficiencies to the test process.

DETAILED DESCRIPTION

Figure 1:
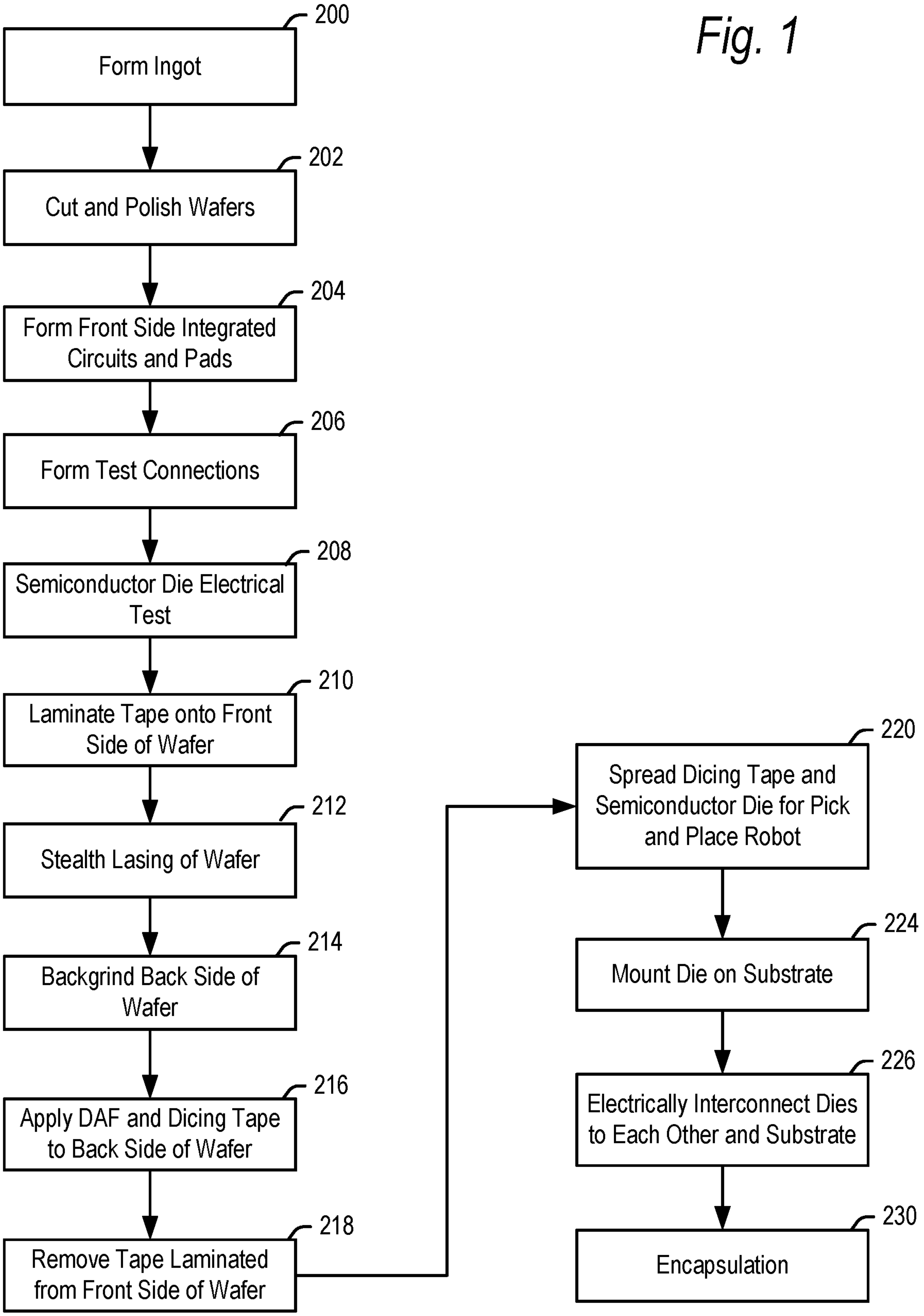
FIG. 1 is a flowchart for forming a wafer with semiconductor dies and laser grooves according to embodiments of the present technology.

The present technology will now be described with reference to the figures, which in embodiments, relate to a semiconductor wafer including pairs of semiconductor dies having test pads which are electrically coupled to each other to enable testing of pairs of semiconductor dies together at the same time. In this way, even wafers having large numbers of semiconductor dies can be tested with a semiconductor test assembly in a single touch-down test process.

The semiconductor test assembly includes a set of test heads, electrically coupled to a probe card. The probe card includes pins that couple to the test pads on one of the semiconductor dies in a pair of coupled dies. In order to differentiate between two common channels of a pair of coupled dies, one of the dies may have traces which electrically couple to a ground pin on the on the probe card while the other of the dies in the pair has traces which electrically couple to a power pin on the probe card. Thus, pairs of dies may be tested simultaneously, while distinguishing test signals on a shared channel from the die pairs.

In a further embodiment, the present technology relates to a semiconductor device including a stack of semiconductor dies mounted to a substrate. Like channels on the different semiconductor dies are electrically coupled to each other and the substrate using bond wires. Additionally, the different semiconductor dies in the stack may be uniquely addressed using the addressing pads on each of the dies in the stack, and a unique configuration of addressing bond wires to the addressing pads on each of the dies in the stack.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±1.5 mm, or alternatively, ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

An embodiment of the present technology will now be explained with reference to the flowchart of FIG. 1, and the views of FIGS. 2-22. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 202, the semiconductor wafer 100 may be cut from an ingot and polished on both the first major surface 102 (FIG. 2), and the second major surface opposite surface 102, to provide smooth parallel surfaces. In step 204, the first major surface 102 may undergo various processing steps to divide the wafer 100 into respective semiconductor dies 106 (one of which is numbered in FIG. 2), and to form integrated circuits of the respective semiconductor dies 106 in active areas of the dies on and/or in the first major surface 102. These various processing steps may include photolithographic steps and metallization steps depositing metal traces and contacts for transferring signals to and from the integrated circuits. The electrical contacts may include die bond pads 108 (one of which is numbered in FIG. 2) exposed on the first major surface 102. The die bond pads 108 may be formed along one of the long edges of the semiconductor dies 106.

Figure 2:
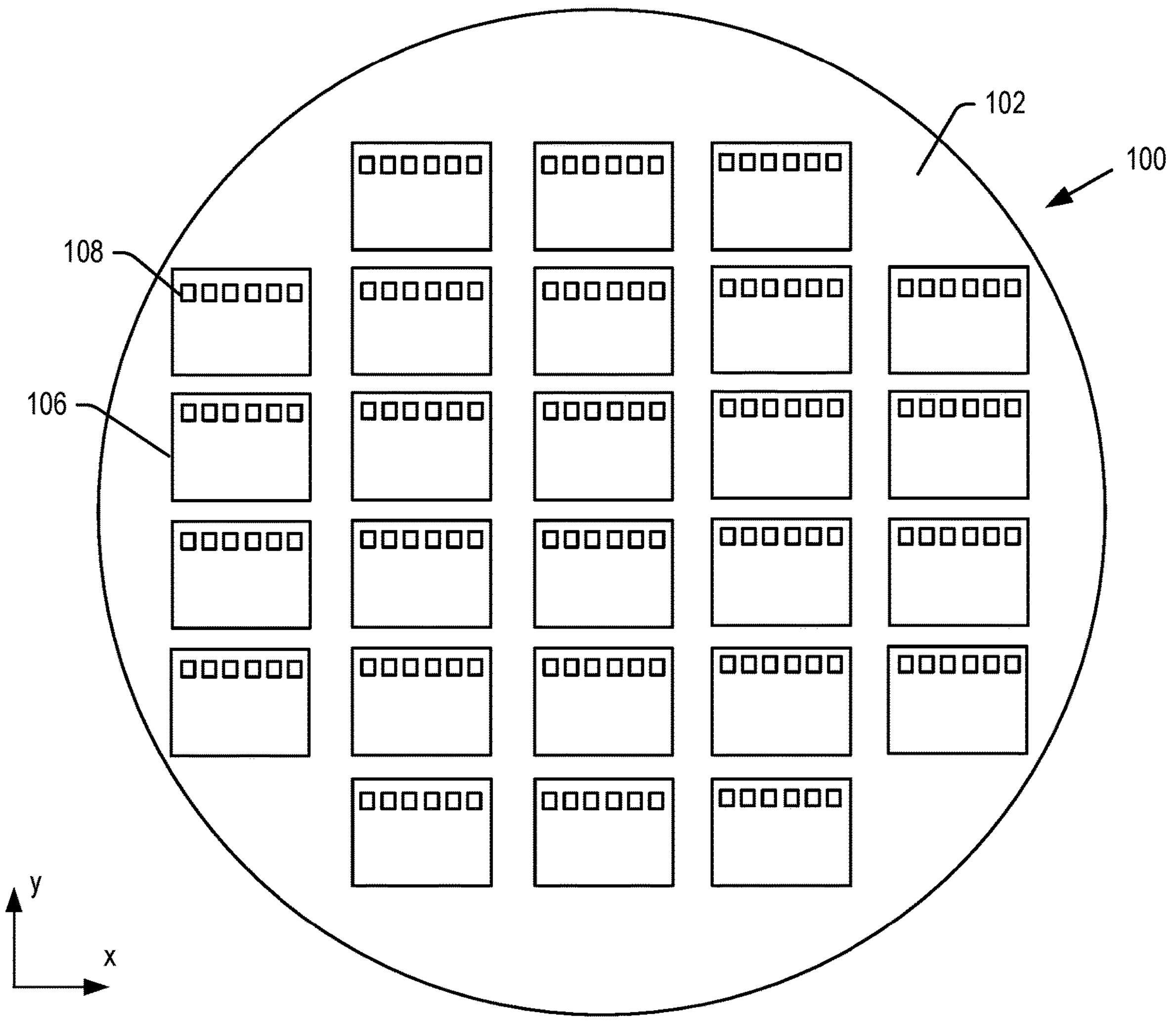
FIG. 2 is a front view of a semiconductor wafer showing a first major surface of the wafer.

The semiconductor dies 106 on wafer 100 may be oriented horizontally to each other (e.g., along the x-axis), and oriented vertically to each other (e.g., along the y-axis). The number of semiconductor dies 106 shown on wafer 100 in FIG. 2 is for illustrative purposes, and wafer 100 may include more semiconductor dies 106 than are shown. In embodiments, the integrated circuits may be configured as flash memory such as 2D NAND flash memory or 3D BiCS (Bit Cost Scaling), V-NAND or other 3D flash memory, though other types of integrated circuits are contemplated.

Figure 3:
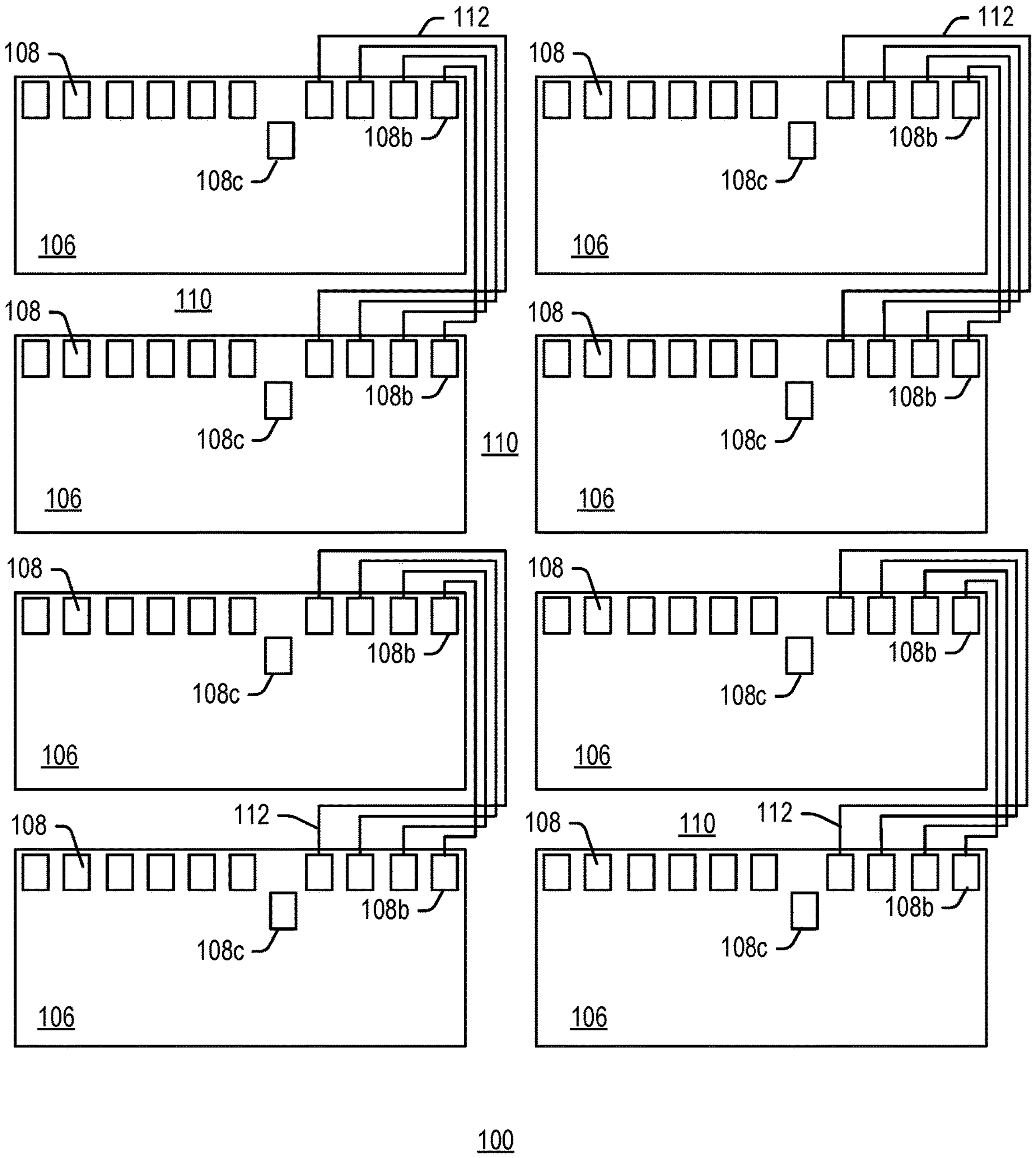
FIG. 3 is a front view of a portion of a semiconductor wafer including semiconductor dies and traces in the scribe lines according to embodiments of the present technology.

FIG. 3 is an enlarged top view showing a number of semiconductor dies 106 from a portion of wafer 100. Each of the dies may be separated from each other by scribe lines 110 which extend vertically and horizontally around each semiconductor dies. These scribe lines do not include integrated circuits for the operation of the semiconductor dies 106 and do not form part of the active areas of the semiconductor dies 106. These scribe lines are at least partially removed when the semiconductor dies are diced from the wafer 100 as explained below.

As shown, each die 106 may include die bond pads 108 to transfer signals to/from the die. The die bond pads 108 on each die 106 include a set of bond pads **108*b* which are used as test pads for testing the operation of each die. While four test pads 108*b* are shown, there may be more or less in further embodiments. The die bond pads 108 may further include a bonding-option pad 108*c* which gets coupled to a power or ground pin of a semiconductor die test assembly as explained below. The bonding-option pad 108*c* is shown out of line with the other die bond pads 108 for clarity, but may be aligned with the other die bond pads in implementation. The number of bond pads 108 shown on each semiconductor die 106 on wafer 100 in FIGS. 2 and 3 is for illustrative purposes, and each die 106 may include more die bond pads than are shown. The die bond pads 108 may for example be formed of aluminum, or alloys thereof, but the pads 108** may be formed of other materials in further embodiments.

In accordance with aspects of the present technology, in step 206, the test pads 108*b* of pairs of semiconductor dies are electrically coupled to each other with electrical traces 112, extending between the die pairs in the scribe lines 110. Dies 106 electrically coupled by traces 112 are at times referred to herein as die pairs. All of the semiconductor dies 106 may be similarly configured on wafer 100. In the example illustrated in FIG. 3, the test pads 108*b* of vertically adjacent semiconductor dies 106 are coupled together. However, in further embodiments, some of which are explained below, the test pads of horizontally adjacent semiconductor dies 106 may be coupled together. The electrical traces 112 are formed such that corresponding channels on each die in a die pair are coupled together.

The electrical traces 112 may be formed in step 206 after the formation of the integrated circuits in step 204 using a reticle in which the electrical traces 112 are formed on top of the first major surface 102 in scribe lines 110 by photolithography. In further embodiments, the electrical traces 112 may be formed within surface 102 during the metallization processes of step 204. In particular, as noted above, during the formation of integrated circuits in each die 106 in step 204, a number of metal layers are formed within surface 102 including a pattern of electrical traces for the transferring signals to and from the integrated circuits of each die 106. The metal layers are separated from each other by silicon dioxide or other dielectric material, and the traces of the different metal layers are coupled to each other and bond pads 108 by plated or filled vias extending orthogonally between the metal layers. In embodiments, the traces 112 may be formed in one of these metal layers in step 204 to couple the test pads 108*b* of a pair of semiconductor dies 106.

Figure 4:
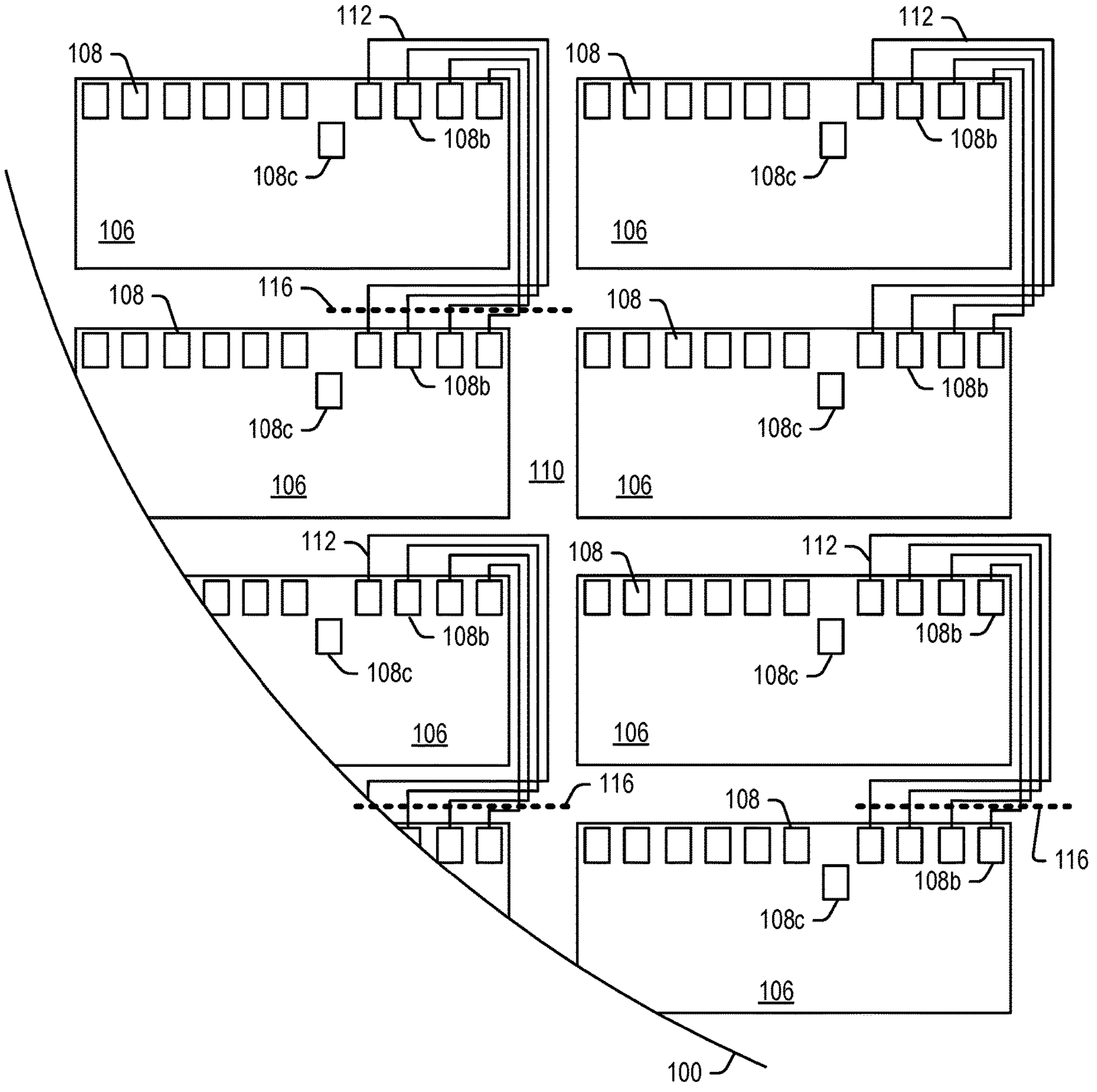
FIG. 4 is a front view of a portion of a semiconductor wafer including semiconductor dies and traces in the scribe lines at an edge of the wafer according to embodiments of the present technology.

FIG. 4 illustrates a top view of an edge 100*a* of the semiconductor die 106. As shown, some semiconductor dies 106 may be partially formed at the edge 100*a*. For these partial semiconductor dies, the electrical traces 112 may be severed, for example by a laser forming cut lines 116, so that the partial dies do not get tested by the semiconductor test assembly (explained below). In further embodiments, these partial dies may be mapped and identified before electrical traces 112 are formed. In such an embodiment, the electrical traces 112 may be omitted from any partial dies.

Figure 5:
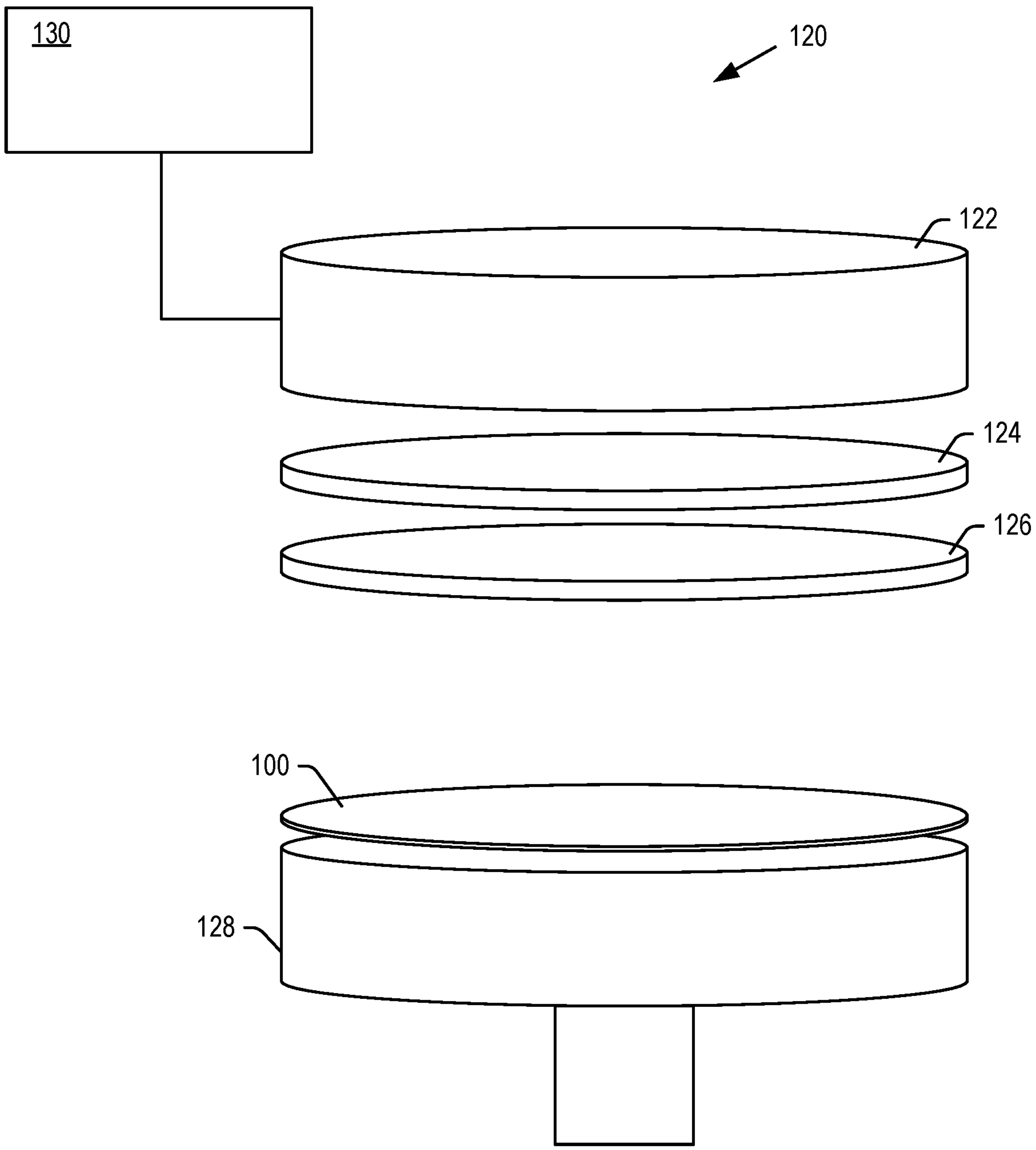
FIG. 5 is a schematic perspective view of a semiconductor test assembly according to embodiments of the present technology.

In step 208, the semiconductor dies 106 on wafer 100 may be operationally tested, or sorted, by a semiconductor test assembly 120, schematically shown in FIG. 5. The test assembly 120 may include a pattern (not shown) of test heads 122. The test heads each include test circuits connected to a test controller 130 which supplies power and logic signals to the test circuits of the test heads. Conventionally, the pattern of test heads would match the pattern of semiconductor dies on the wafer to enable parallel (simultaneous) testing all of the dies on the wafer. However, at times, this is no longer possible, for example where the number of semiconductor dies is larger than the number of test heads. This mismatch is a problem addressed by the present technology.

The test assembly 120 further includes a printed circuit board (PCB) 124 affixed to the test heads, and a probe card 126 affixed to the PCB 124. While the test heads 122, PCB 124 and probe card 126 are shown spaced from each other for clarity in FIG. 5, those components may be affixed to each other in implementation. The probe card 126 includes individual instances, each including a pattern of pins configured to touch-down on select test pads and voltage pads on each pair of the dies 106 on wafer 100 connected by traces 112. In embodiments, the instances on probe card 126 are configured for a specific configuration of semiconductor dies 106 on wafer 100, for example having one instance match each pair of the dies 106 on wafer 100. During the test operation step 208, the wafer 100 may be supported on a chuck 128. With the wafer 100 supported on chuck 128, the pins of the probe card touch-down on select test pads 108*b*, bonding-option pads 108*c* and (in embodiments) other pads on wafer 100 as explained below to enable parallel testing of all dies 106 on wafer 100 at the same time.

Figure 6:
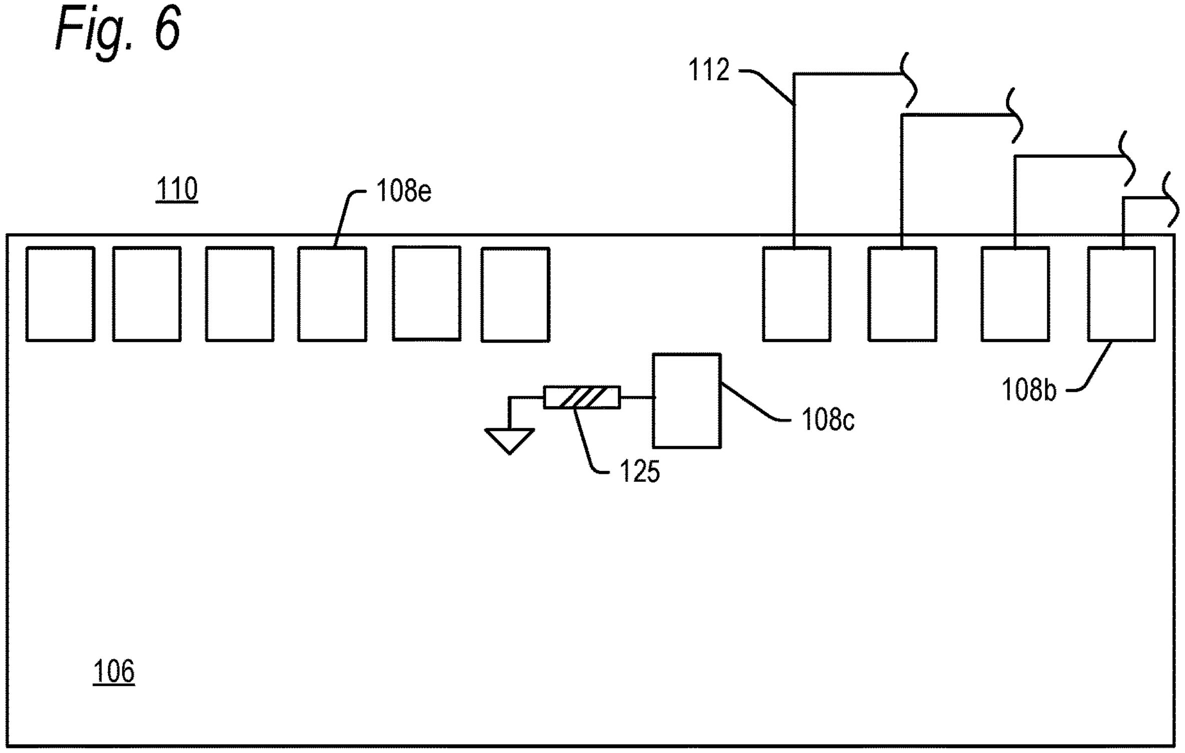
FIG. 6 is a top view of a portion of a semiconductor die including an address pad coupled to a pull-down resistor according to embodiments of the present technology.

FIG. 6 illustrates a semiconductor die 106 from wafer 100 having die bond pads 108 including test pads 108*b* as described above. Traces 112 are partially shown in scribe lines 110 for coupling the test pads 108*b* to the test pads 108*b* of a second die (not shown) as described above. In this example, the bonding-option pad 108*c* is coupled to a pull-down resistor 125, which is coupled within die 106 to a ground pad on die 106. The bonding-option pad 108*c* may for example be chip address pads CADD #0, CADD #1 and CADD #2 typically provided in NAND flash memory dies. The pull down resistor 125 functions as a weak on-chip pull down to ground, meaning that, in the absence of a connection of bonding-option pad 108*c* to a power source, the bonding-option pad 108*c* is set to a logical 0. However, if bonding-option pad 108*c* is connected to a power source by a bonding wire, the bonding-option pad 108*c* will have a logical 1. The pull-down resistor 125 forms a leakage path from the power source to ground, but the leakage can be suppressed with the high resistance of the pull down resistor 125.

Figure 7:
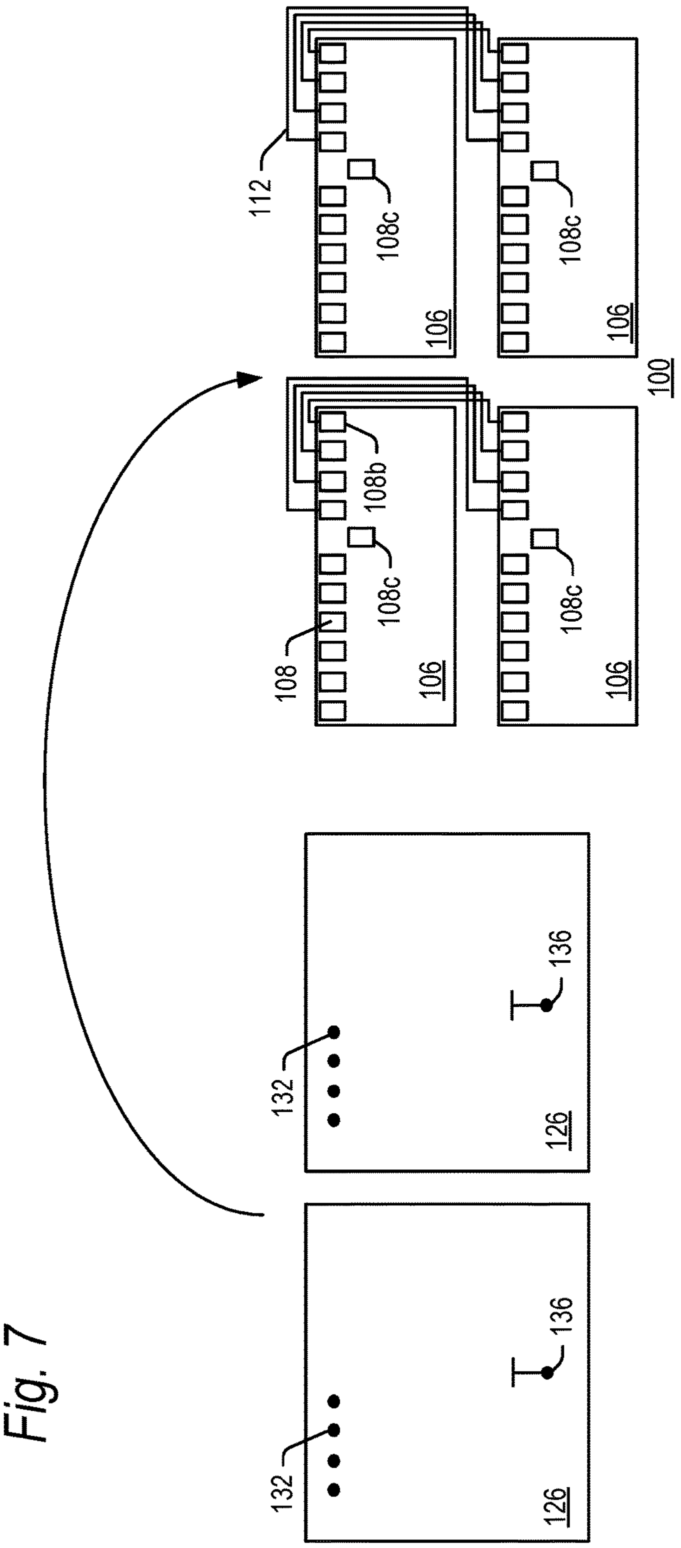
FIG. 7 is a top view of a portion of a semiconductor wafer juxtaposed next to a bottom view of a portion of a probe card according to embodiments of the present technology.

This configuration is used to assign a logic address 0 to a first die 106 and logic address 1 to a second die 106 in a pair of dies coupled by traces 112. FIG. 7 illustrates a portion of wafer 100 (to the right) including four semiconductor dies 106. As explained above, the portion of the wafer shown includes a first pair of semiconductor dies 106 electrically coupled together with traces 112 in scribe lines 110, and a second pair of semiconductor dies 106 electrically coupled together with traces 112 in scribe lines 110. FIG. 7 also shows bonding-option pads 108*c* on each semiconductor die 106. The bonding-option pads 108*c* on each die 106 have pull-down resistors 125 as described above. The pull-down resistors are now shown in FIG. 7 for clarity.

FIG. 7 further illustrates two instances from probe card 126 (to the left), each instance including test pins 132 and power pin 136. Each instance on probe card 126 may be identical to each other, and each instance on probe card 126 is customized for wafer 100 to touch-down on each pair of semiconductor dies 106 connected by traces 112.

Figure 8:
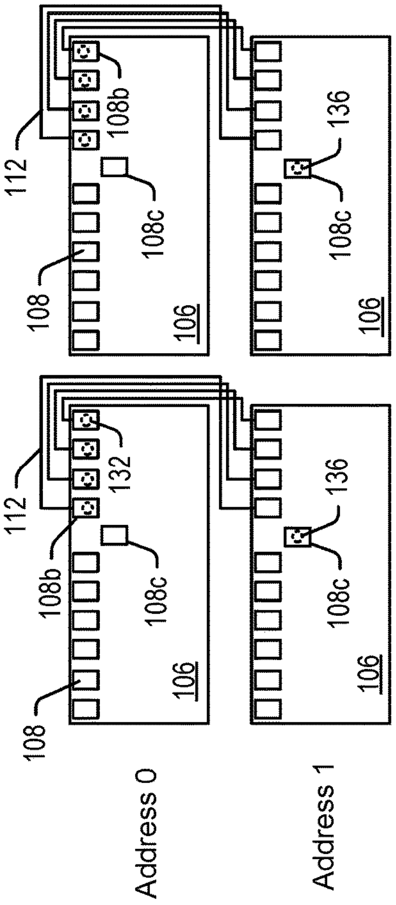
FIG. 8 is a top view of a portion of a semiconductor wafer with a portion of a probe card (shown in phantom) seated thereon according to embodiments of the present technology.

FIG. 7 shows a top view of the portion of wafer 100 and bottom view of the portion of probe card 126. As indicated by the arrow, the probe card 126 would in fact be flipped over when supported on PCB 124 so that, when the probe card 126 touches down on wafer 100 as shown in FIG. 8, the test pins 132 touch-down on the test pads 108*b* on one of the dies in each die pair. In the embodiment shown, the test pins 132 are positioned on each instance of probe card 126 to touch-down on the top die 106 of each die pair. In further embodiments, the test pins may alternatively be positioned lower down on each instance of the probe card 126 to touch-down on the bottom die 106 of each die pair.

With each die pair electrically coupled to each other by traces 112, signals are transmitted to and from the test heads 122 through PCB 124 and the test pins on each instance of the probe card 126 to test each die pair simultaneously. From the perspective of the test heads 122, each die pair is treated as a single larger die, in effect halving the number of dies to be tested by the test heads 122. Even where wafer 100 includes large numbers of semiconductor dies 106, effectively halving the number of dies leaves more than enough test heads to simultaneously test each of the die pairs at the same time in a single touch-down.

As the traces 112 couple like channels on each die pair, simply testing each die pair with test pins 132 would not enable the test heads 122 and test controller 130 to distinguish between like channels on the dies in the die pair. Thus, where the test controller detects faulty signals on a channel of a die pair, it needs to be able to distinguish which die in a die pair resulted in that faulty signal. In accordance with the present technology, this information is given by the power pin 136 on each instance of the probe card 126. The power pin 136 may be connected through the probe card 126 and PCB 124 to a power voltage, VS S, in the test assembly.

As described above, in the absence of a voltage, the pull-down resistor 125 assigns the top die of each pair to logic Address 0. As shown in FIG. 8, when the probe card 126 touches down on wafer 100, the power pin 136 mates with bonding-option pad 108*c* on the bottom die of each die pair, and overcomes the bias of the ground connection of bonding-option pad 108*c* to thus assign Address 1 to the bottom die in each die pair. This allows the channels on each die 106 in a die pair to be distinguished from each other, for example enabling the die with Address 0 to be tested first, and enabling the die with Address 1 to be tested second (or vice-versa). Using the unique addresses provided by the touch-down of the power pins 136 on the bonding-option pads 108*c* of dies 106, the dies 106 in each die pair may be tested simultaneously in further embodiments.

The positions of the power pins 136 on probe card 126 may be switched, to assign Address 1 to the top die in each die pair, and Address 0 to the bottom die of each die pair. Moreover, given the connections of traces 112, the semiconductor dies 106 in each die pair are vertically oriented with respect to each other in FIGS. 7 and 8. However, as noted, in further embodiments, the semiconductor dies 106 in each die pair may be horizontally oriented with respect to each other. The positions of the test pins 132 and power pin 136 on each instance of the probe card 126 may be adjusted accordingly where die pairs are horizontally oriented to provide the appropriate contact of test pins 132 with the test pads 108*b* on one of the dies of each die pair, and to provide the appropriate contact of the power pins 136 with the bonding-option pads 108*c* on each semiconductor die 106 of each die pair.

FIGS. 9A-12 illustrate a further embodiment of the present technology. In this embodiment, each semiconductor die 106 includes die bond pads 108, including test pads 108*b*, as described above. Each pair of dies 106 may be electrically coupled together with traces 112 in scribe lines 110 as described above (in the example shown in FIG. 10, the semiconductor dies 106 in each die pair are horizontally oriented with respect to each other). In this embodiment, instead of using bonding-option pads 108*c*, semiconductor dies 106 in each die pair are distinguished from each other using die bond pads 108*d* which are the core address pads CADD #0, CADD #1 and CADD #2. This embodiment further includes pull-down resistor 140 and pull-up resistor 142 as explained below.

Figure 9A:
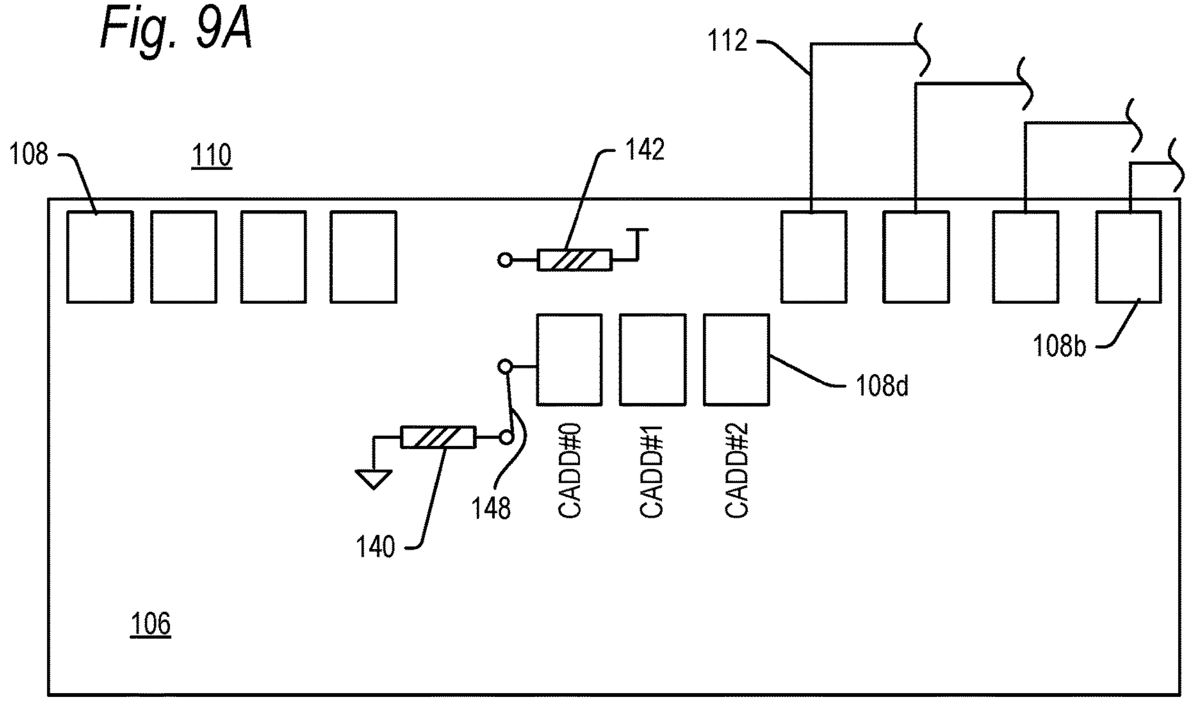
FIGS. 9A and 9B are top views of a first semiconductor die coupled to a pull-down resistor and a second semiconductor die coupled to a pull-up resistor, respectively, according to embodiments of the present technology.
Figure 9B:
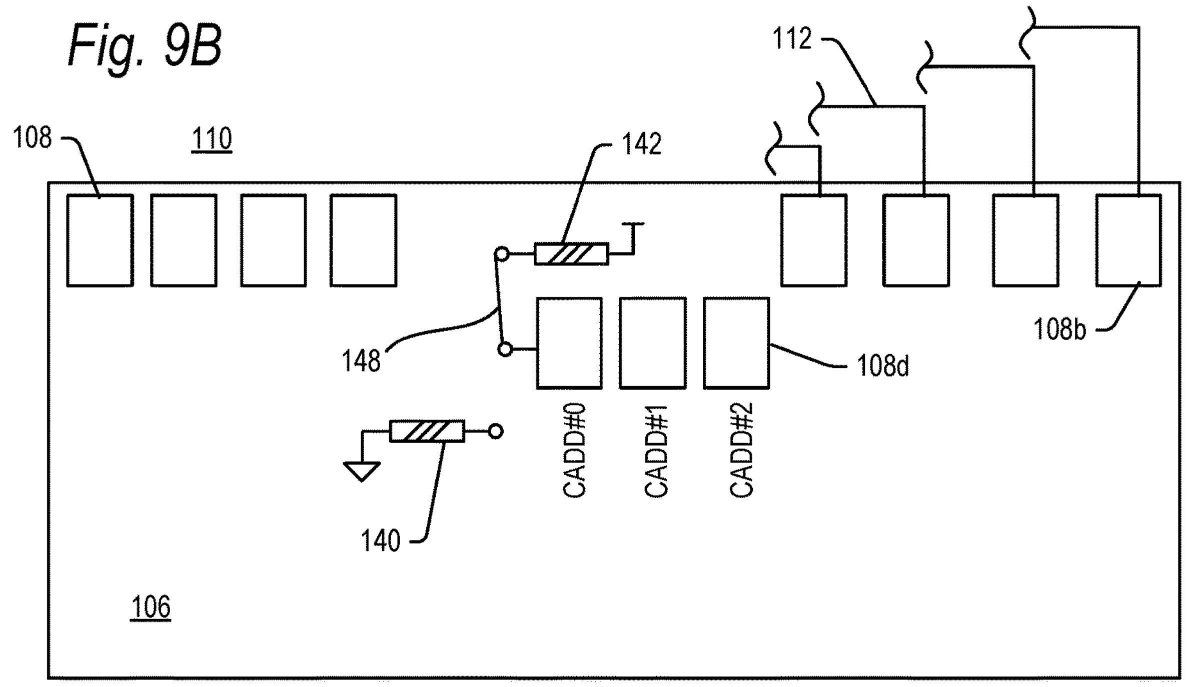

This embodiment further includes trace 148 on each semiconductor die 106 which (in this embodiment) is coupled at one end to CADD #0. As explained below, trace 148 may be coupled to CADD #0, CADD #1 and/or CADD #2 in further embodiments. FIG. 9A shows a top view a first semiconductor die 106 in a die pair, with a second end of trace 148 coupled to pull-down resistor 140. FIG. 9B shows a top view of a second semiconductor die 106 in a die pair, with a second end of trace 148 coupled to pull-up resistor 142. Pull-up resistor functions similarly to pull-down resistor 140, but is instead coupled to a voltage source for a weak pull up to logical 1.

Trace 148 performs as a switch, coupling one or more of the CADD pads 108*d* to either the pull-down resistor 140 or the pull-up resistor 142. Trace 148 is also referred to herein as a switching trace 148. The pull-down and pull-up resistors 140, 142 may be formed in step 204 when the dies 106 are defined in wafer 100. Alternatively, the pull-down and pull-up resistors 140, 142 may be formed or affixed on top of the first major surface 102 after the semiconductor dies 106 are defined in wafer 100. Traces 148 may be formed in the metallization layers within the first major surface 102 during step 204, or trace 148 may be formed on top of the first major surface 102 after the semiconductor dies 106 are defined in wafer 100, using for example a reticle. Upon completion, the trace 148 may couple half of the semiconductor dies 106 on wafer 100 to the pull-down resistor 140, and the other half of the semiconductor dies 106 on wafer 100 to the pull-up resistor 142.

Figure 10:
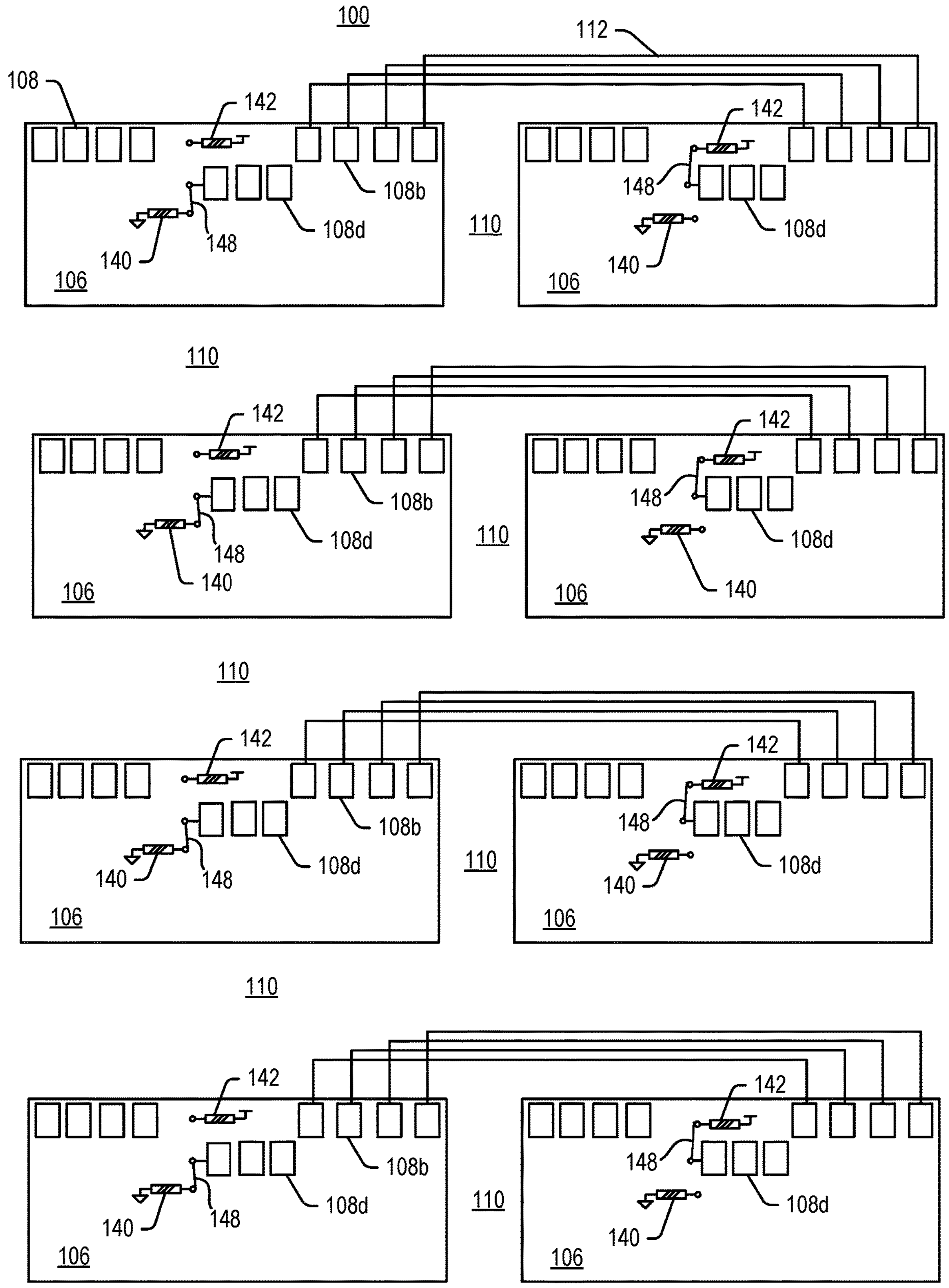
FIG. 10 is a front view of a portion of a semiconductor wafer including the first and second semiconductor dies of FIGS. 9A and 9B and traces in the scribe lines according to embodiments of the present technology.

FIG. 10 is a top view of a portion of wafer 100 showing four die pairs, each pair horizontally coupled to its neighboring semiconductor die 106 with traces 112. In the example illustrated in FIG. 10, the first semiconductor die 106 in each die pair (left column of dies 106) have the CADD pad(s) 108*d* coupled to the pull-down resistor 140 via trace 148. The second semiconductor die 106 in each die pair (right column of dies 106) have the CADD pad(s) 108*d* coupled to the pull-up resistor 142 via trace 148. The remainder of the semiconductor dies 106 may be similarly configured on wafer 100 in this embodiment. In further embodiments, the semiconductor dies 106 in each die pair may alternatively be vertically oriented with respect to each other, similar to the embodiment shown in FIG. 6.

Figure 11:
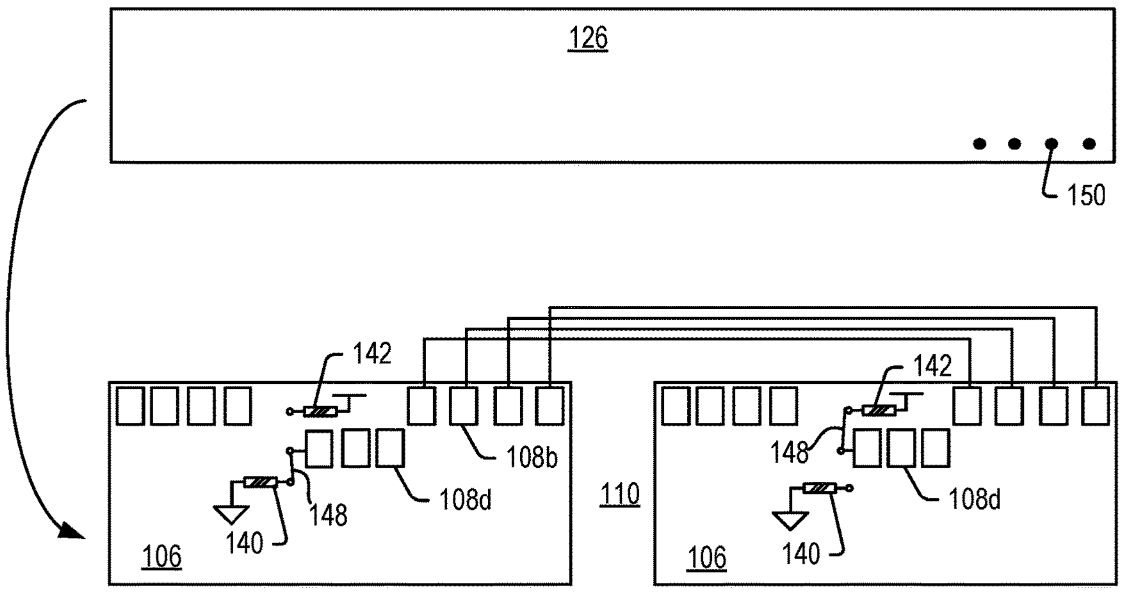
FIG. 11 is a top view of a portion of a semiconductor wafer juxtaposed next to a bottom view of a portion of a probe card according to embodiments of the present technology.

FIG. 11 illustrates a portion of wafer 100 (at the bottom) including two semiconductor dies 106. As explained above, the portion of the wafer shown includes a pair of semiconductor dies 106 electrically coupled together with traces 112 in scribe lines 110, with the first semiconductor die 106 connected to the pull-down resistor 140 by the trace 148 and the second semiconductor die connected to the pull-up resistor 142 by the trace 148.

Figure 12:
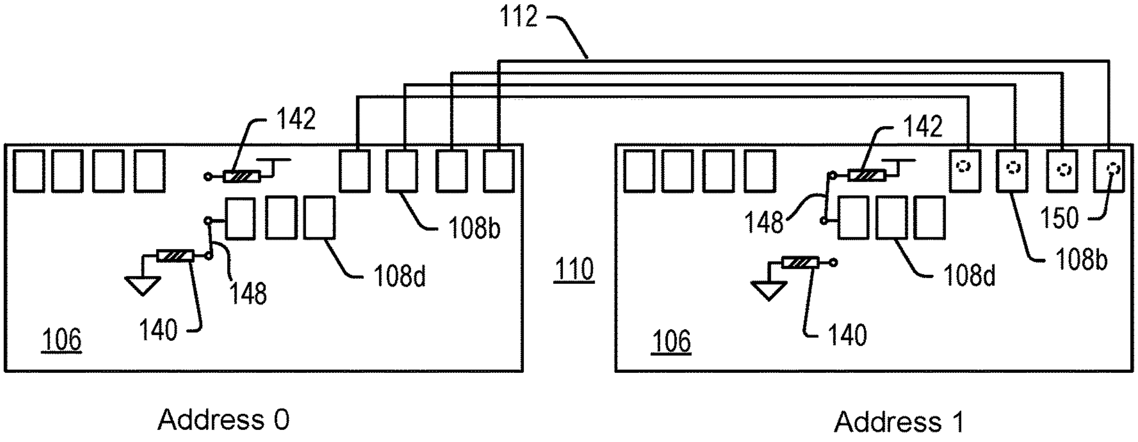
FIG. 12 is a top view of a portion of a semiconductor wafer with a portion of a probe card (shown in phantom) seated thereon according to embodiments of the present technology.
Figure 13:
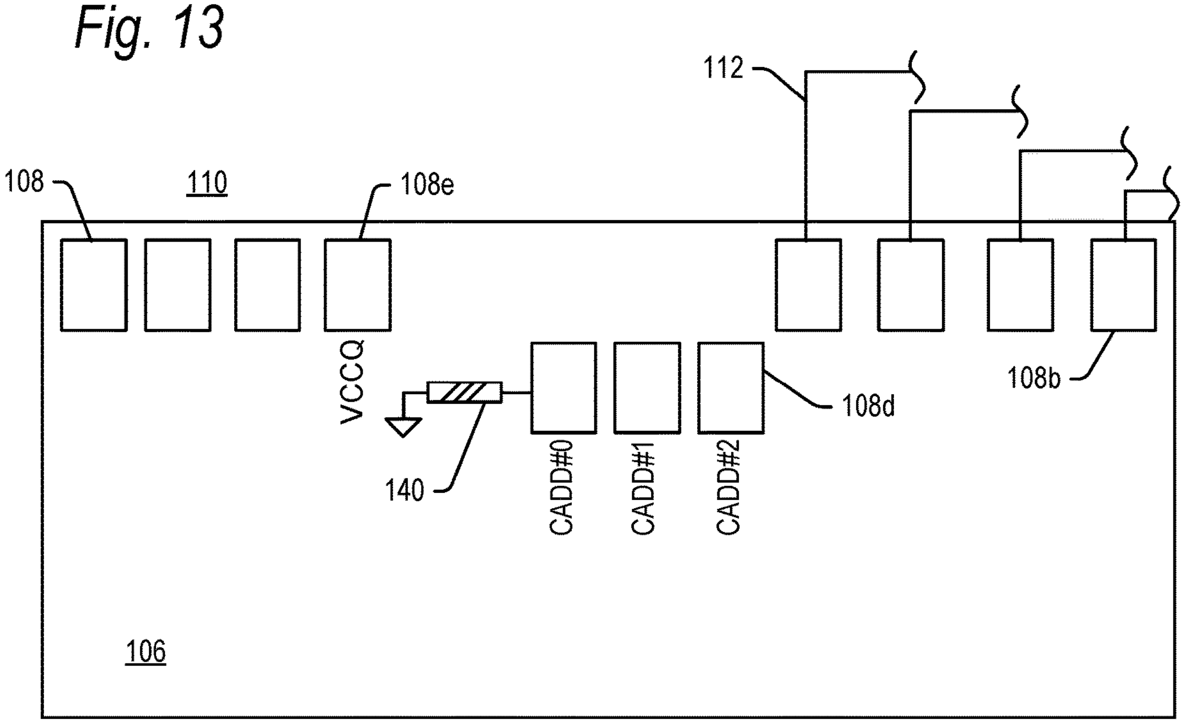
FIG. 13 is a top view of a semiconductor die coupled to a pull-down resistor according to embodiments of the present technology.

FIG. 11 further illustrates an instance from probe card 126 (at the top) including test pins 150. Each instance on probe card 126 may be identical to each other, and the instances together are customized for wafer 100 to touch-down on each pair of semiconductor dies 106 connected by traces 112. FIG. 11 shows a top view of the portion of wafer 100 and bottom view of the portion of probe card 126. As indicated by the arrow, the probe card 126 would be flipped over when supported on PCB 124 so that, when the probe card 126 touches down on wafer 100 as shown in FIG. 12, the test pins 150 touch-down on the test pads 108*b* on one of the dies in each die pair. In the embodiment shown, the test pins 150 are positioned on each instance of probe card 126 to touch-down on the right side die 106 of each die pair. In further embodiments, the test pins may be positioned at the opposed side on each instance of the probe card 126 to touch-down on the left side die 106 of each die pair.

With each die pair electrically coupled to each other by traces 112, signals are transmitted to and from the test heads 122 through PCB 124 and each instance of the probe card 126 to test each die pair simultaneously. Thus, as above, even where wafer 100 includes large numbers of semiconductor dies 106, effectively halving the number of dies leaves more than enough test heads to simultaneously test each of the die pairs at the same time in a single touch-down. In accordance with the present technology, signals from like channels of a given die pair are distinguished from each other by the pull-down an pull-up resistors 140 and 142.

As shown in FIG. 12, when the probe card 126 touches down on wafer 100, trace 148 in the left side die 106 is coupled to the pull-down resistor, thus pulling the CADD #0 pad down to logic Address 0. Similarly, when the probe card 126 touches down on wafer 100, trace 148 in the right side die 106 is coupled to the pull-up resistor, thus pulling the CADD #0 pad up to logic Address 1. This allows the channels on each die 106 in a die pair to be distinguished from each other, for example enabling the die with Address 0 to be tested first, and enabling the die with Address 1 to be tested second (or vice-versa). As noted, the unique addresses of the first and second dies allows them to be tested simultaneously in further embodiments.

The connection of trace 148 to the pull-down or pull-up resistor in FIG. 12 may be switched to assign Address 1 to the left side die in each die pair, and Address 0 to the right side die of each die pair. Moreover, as noted, in further embodiments, the semiconductor dies 106 in each die pair may be vertically oriented with respect to each other. The positions of the test pins 150 on each instance of the probe card 126 may be adjusted accordingly where die pairs are vertically oriented to provide the appropriate contact of test pins 150 with the test pads 108*b* of each die pair. While shown connected to pad CADD #0, the connection may be made to any of the CADD pads 108*d*.

FIGS. 13-16 illustrate a further embodiment of the present technology. In this embodiment, each semiconductor die 106 includes die bond pads 108, including test pads 108*b*, as described above. Each pair of dies 106 may be electrically coupled together (in a vertical or horizontal orientation) with traces 112 in scribe lines 110 as described above. This embodiment also uses the core address pads CADD #0, CADD #1 and/or CADD #2 (pads 108*d*) typically provided in NAND flash memory dies to distinguish the dies in each die pair from each other. In this embodiment, a pull-down resistor 140 is coupled to one of the pads 108 (CADD #0 in the illustrated embodiment) to provide a weak pull-down of the connected pad to logical 0. This embodiment further makes use of a VCCQ power pad 108*e* provided as one of the die bond pads 108 on dies 106. The position of power pad 108*e* is shown by example only and may be in other positions in implementation.

Figure 14:
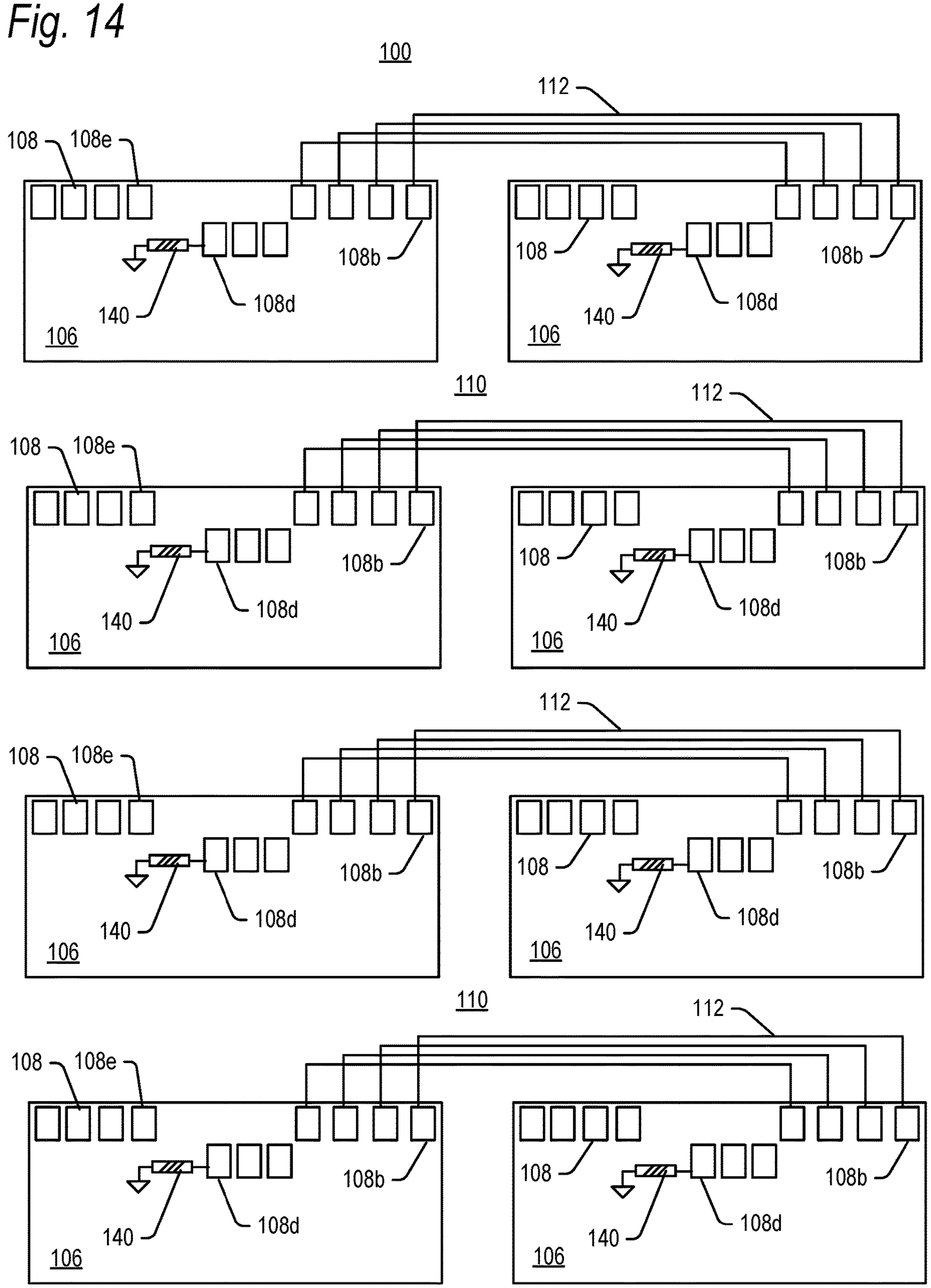
FIG. 14 is a front view of a portion of a semiconductor wafer including the semiconductor die of FIG. 13 and traces in the scribe lines according to embodiments of the present technology.

FIG. 14 is a top view of a portion of wafer 100 showing four die pairs, each pair horizontally coupled to its neighboring semiconductor die 106 with traces 112. In the example illustrated in FIG. 14, all of the semiconductor dies 106 are identical to each other, each including the pull-down resistor 140 electrically coupled to one of the CADD pads 108*d*. In this embodiment, the semiconductor dies 106 in each die pair may alternatively be vertically oriented with respect to each other, similar to the embodiment shown in FIG. 6.

Figure 15:
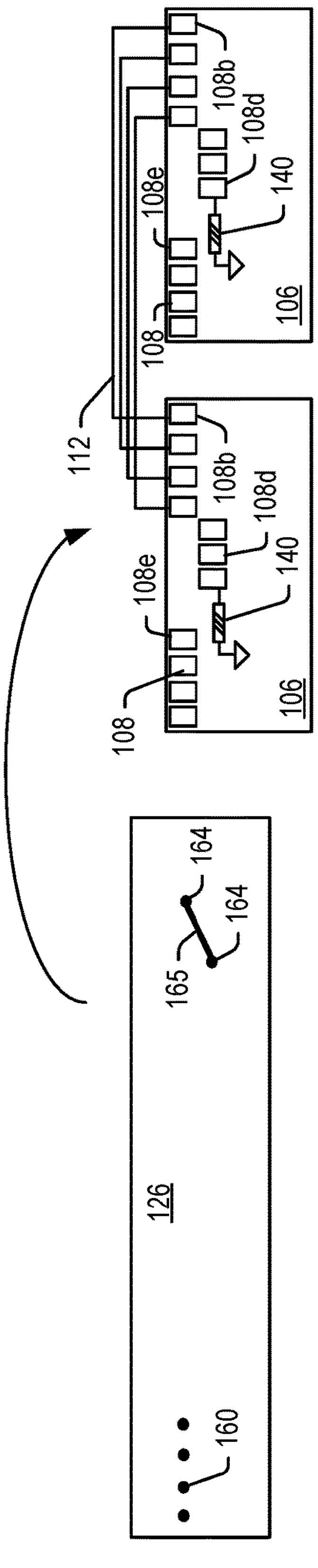
FIG. 15 is a top view of a portion of a semiconductor wafer juxtaposed next to a bottom view of a portion of a probe card according to embodiments of the present technology.

FIG. 15 illustrates a portion of wafer 100 (to the right) including two semiconductor dies 106. As explained above, the portion of the wafer shown includes a pair of semiconductor dies 106 electrically coupled together with traces 112 in scribe lines 110. Each die 106 includes the pull-down resistor 140 electrically coupled to CADD #0 pad 108*d*.

Figure 16:
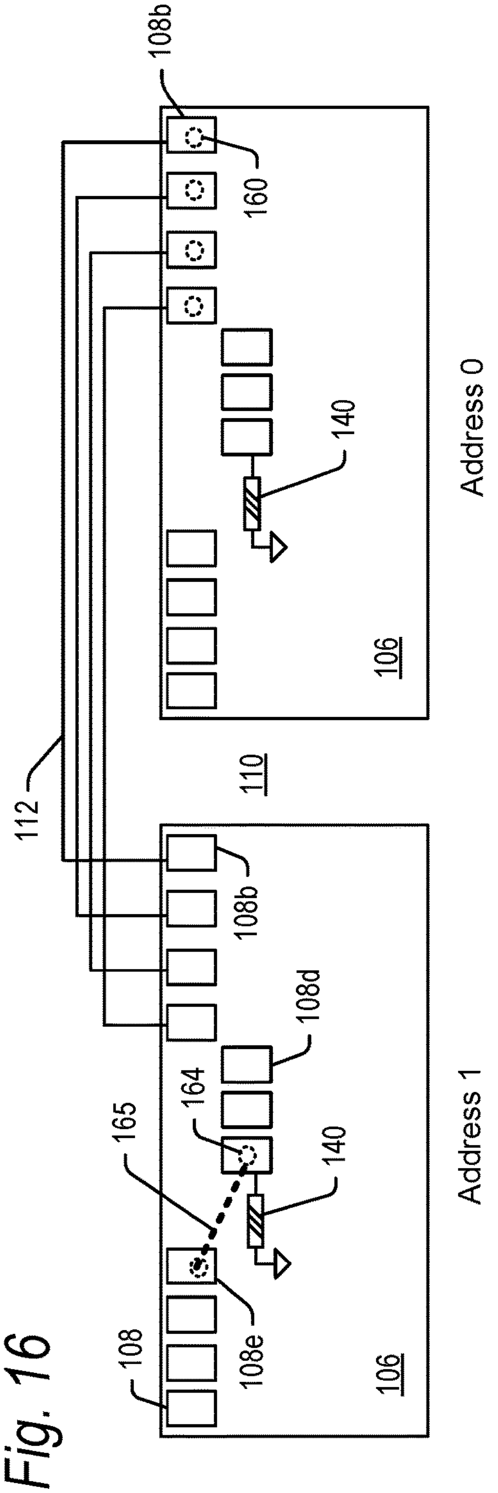
FIG. 16 is a top view of a portion of a semiconductor wafer with a portion of a probe card (shown in phantom) seated thereon according to embodiments of the present technology.

FIG. 15 further illustrates an instance from probe card 126 (to the left) including test pins 160, power pins 164 and trace 165 electrically connecting power pins 164. Each instance on probe card 126 may be identical to each other, and the instances together are customized for wafer 100 to touch-down on each pair of semiconductor dies 106 connected by traces 112. FIG. 15 shows a top view of the portion of wafer 100 and bottom view of the portion of probe card 126. As indicated by the arrow, the probe card 126 would be flipped over when supported on PCB 124 so that, when the probe card 126 touches down on wafer 100 as shown in FIG. 16, the test pins 160 touch-down on the test pads 108*b* on one of the dies in each die pair. In the embodiment shown, the test pins 160 are positioned on each instance of probe card 126 to touch-down on the right side die 106 of each die pair. In further embodiments, the test pins may be positioned at the opposed side on each instance of the probe card 126 to touch-down on the left side die 106 of each die pair.

With each die pair electrically coupled to each other by traces 112, signals are transmitted to and from the test heads 122 through PCB 124 and each instance of the probe card 126 to test each die pair simultaneously. Thus, as above, even where wafer 100 includes large numbers of semiconductor dies 106, effectively halving the number of dies leaves more than enough test heads to simultaneously test each of the die pairs at the same time in a single touch-down. In accordance with the present technology, signals from like channels of a given die pair are distinguished from each other by pull-down resistor 140, power pins 164 and trace 165. The VCCQ power pad 108*e* may be connected to a power signal in the test assembly 120.

As shown in FIG. 16, when the probe card 126 touches down on wafer 100, the pull-down resistor pulls the CADD #0 pad down to logic Address 0. However, for the left hand die, when the probe card 126 touches down on wafer 100, the power pins 164 touch-down on VCCQ power pad 108*e* and CADD #0, respectively. The trace 165 on the probe card 126 electrically connects the VCCQ power pad 108*e* to the CADD #0 pad. During the electrical test, the VCCQ power pad 108*e* is connected to power so that, when coupled to the VCCQ power pad 108*e* by trace 165 on touch-down, the CADD #0 pad is pulled up to logic Address 1. This allows the channels on each die 106 in a die pair to be distinguished from each other, for example enabling the die with Address 0 to be tested first, and enabling the die with Address 1 to be tested second (or vice-versa). Given the unique address of each die 106, the dies in a die pair may be tested simultaneously in further embodiments.

The relative positions of power pins 164 and trace 165 on the probe card may be reversed in further embodiments to assign Address 0 to the left side die in each die pair, and Address 1 to the right side die of each die pair. Moreover, as noted, in further embodiments, the semiconductor dies 106 in each die pair may be vertically oriented with respect to each other. The positions of the test pins 160, power pins 164 and trace 165 on each instance of the probe card 126 may be adjusted accordingly where die pairs are vertically oriented to provide the appropriate contact of test pins 160 with the test pads 108*b* of each die pair, and to provide the appropriate contact of the power pins 164 on the VCCQ power pad 108*e* and the CADD pad 108*d* on each semiconductor die 106 of each die pair. While shown connected to pad CADD #0, the connection may be made to any of the CADD pads 108*d*.

Using any of the above-described embodiments, the semiconductor dies 106 are electrically tested in step 208. The electrical testing may include the test assembly 120 sending read/write instructions to the different memory locations on each semiconductor die and checking to ensure the instructions were properly implemented. The testing step 208 may be used to sort the semiconductor dies into different bins, depending on how well the semiconductor dies do in the testing step.

Referring again to the flowchart of FIG. 1, after the dies are electrically tested in step 208, a layer of tape may be laminated onto the major surface 102 of wafer 100 in step 210. The wafer 100 may then be turned over, and diced in step 212. In embodiments, the wafer 100 may be diced using an SDBG (stealth dicing before grinding). With the first major (active) surface of wafer 100 supported on a chuck, a laser (not shown) may emit a pulsed laser beam at a wavelength that transmits through the second major surface of the wafer 100, for example at infrared or near-infrared wavelengths, to create a number of pinpoint holes at an intermediate depth of the wafer. The laser may be moved in rows and columns along scribe lines 110 in a plane of the wafer to define the outline of each semiconductor die 106. The pinpoint holes generate cracks in the wafer along crystalline planes to effectively dice the semiconductor dies from the wafers.

Of relevance to the present technology, the dicing step 210 severs each of the traces 112 between the pairs of dies to electrically isolate each semiconductor die 106 from each other. Instead of dicing by SDBG, the dies 106 may be diced from wafer 100 by sawing, water jet cutting or other methods. Each such method severs the traces 112 between the pairs of dies.

After the dicing step 212, the wafer may then be thinned in step 214 using a grinding wheel (not shown) applied to the second major surface. The grinding wheel may thin the wafer 100 from, for example, 780 μm to its final thickness. In embodiments, the final wafer thickness may be between 25 μm and 102 μm, such as for example between 25 μm and 36 μm. It is understood that the wafer 100 may be thinner or thicker than this range after the backgrind step in further embodiments.

After completion of the backgrind step 214, a layer of die attach film (DAF) adhered to a flexible dicing tape may be applied to a second major surface of the wafer 100 in step 216. The wafer 100 may then be turned over and supported on a chuck or other support surface, and the lamination tape on the first major surface 102 of the wafer 100 may be removed in step 218. Once on the chuck, the flexible dicing tape may be stretched along orthogonal axes to separate the individual semiconductor dies 106 in step 220 to allow the individual semiconductor dies 106 to be removed by a pick and place robot for inclusion in a semiconductor package.

Figure 17:
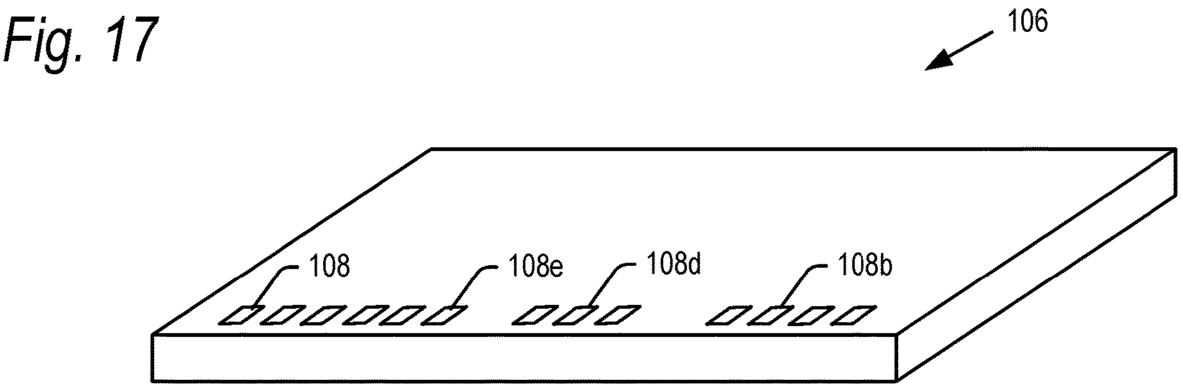
FIG. 17 illustrates a perspective view of a semiconductor die fabricated according to embodiments of the present technology.

FIG. 17 shows a semiconductor die 106 after separation from wafer 100. The illustration shows die bond pads 108, including the test pads **108*b*, CADD address pads 108*d* and VCCQ power pad 108*e*. Again, the positions of these pads on the semiconductor die 106** are shown by way of example only and may be otherwise arranged in further embodiments.

Figure 18:
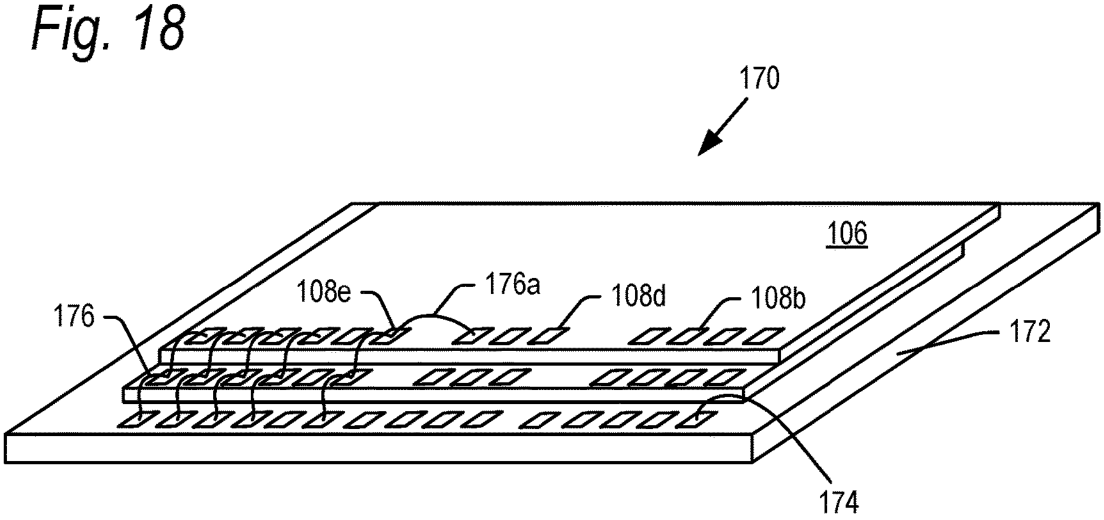
FIG. 18 is a perspective view of a semiconductor device including semiconductor dies fabricated according to embodiments of the present technology including addressing bond wires.
Figure 19:
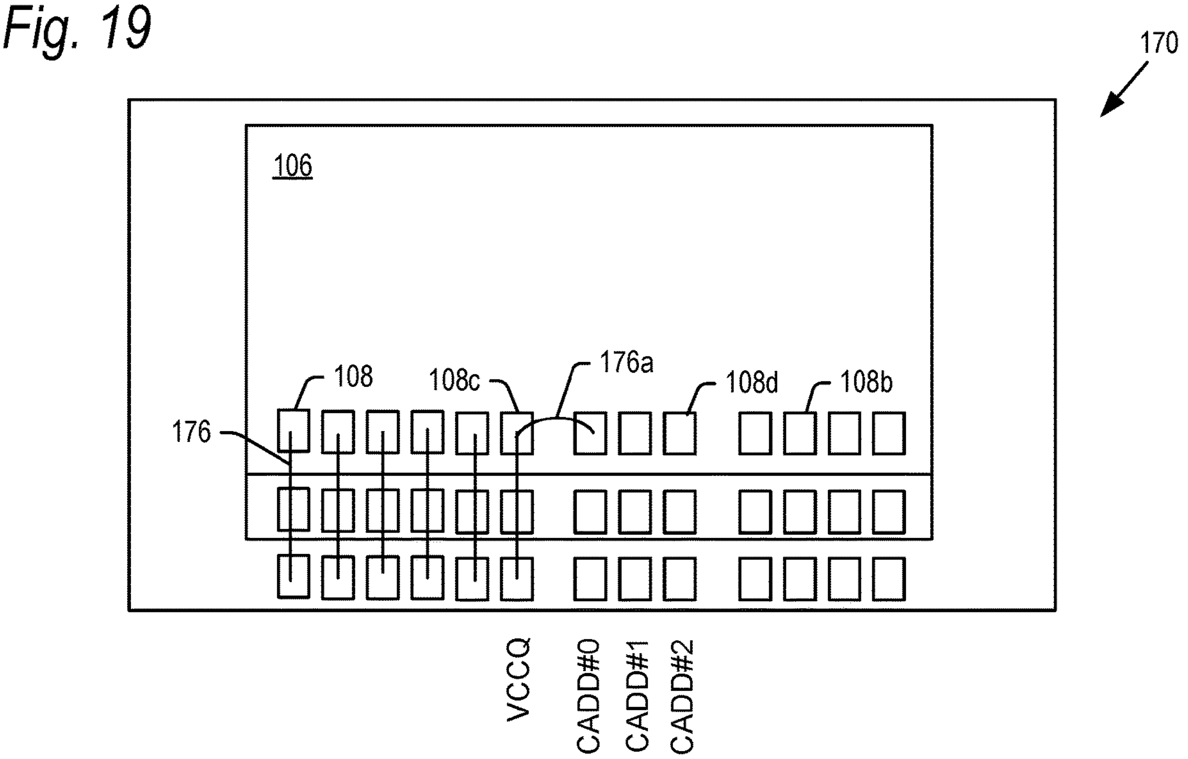
FIG. 19 is a front view of a semiconductor device including semiconductor dies and addressing bond wires fabricated according to embodiments of the present technology.

FIGS. 18 and 19 are perspective and top views of a semiconductor device 170 including a stack of semiconductor dies 106 formed according to the present technology. In step 224 (FIG. 1), the pick and place robot may stack dies on a substrate 172. The stack is shown as including two semiconductor dies 106, but the stack may include less than two or more than two semiconductor dies 106 in further embodiments, including for example four, eight, sixteen, thirty-two or sixty-four semiconductor dies. The semiconductor dies are shown mounted on a substrate 172, though the semiconductor dies may be formed in a chip scale package without a substrate in further embodiments.

It is typical to stack semiconductor dies on a substrate with an offset so that the bond pads of first (lower) semiconductor die are left exposed when the next upper semiconductor die is added to the die stack. This allows the die bond pads of each of the semiconductor dies 106 to be electrically connected to each other and the substrate 172 using bond wires (step 226, FIG. 1). FIGS. 18 and 19 show bond wires 176 connecting same channel die bond pads to each other and substrate 172 down the die stack. In FIGS. 18 and 19, no bond wires are formed on test pads **108*b*, but the like-channel test pads 108*b* on the different dies 106 may be wire bonded together as in the other bond pads 108** in further embodiments.

As like channels of each semiconductor die are electrically coupled to each other with bond wires 176, a methodology is needed to uniquely address each semiconductor die so that read/write instructions are performed on the desired die 106 in the die stack. In accordance with the present technology, each die may be uniquely addressed using the CADD pads **108*d* and the VCCQ pad 108*e*. As seen in FIG. 18, an addressing bond wire 176*a* may be formed between the VCCQ pad 108*e* and pad CADD #0 of the top die, but not the bottom die. Upon receiving a power signal from the substrate on VCCQ pad 108*e*, the connection to the pad CADD #0 on the top die with bond wire 176*a* will assign a logic Address 1 to the top die 106. Having no connection at the CADD pads 108*d*, the bottom die will have a logic Address 0. Using this scheme, the dies 106** in the die stack may be distinguished from each other for read/write operations.

FIGS. 18 and 19 show the top die 106 having a bond wire **176*a* between the VCCQ pad 108*e* and the CADD #0 pad. However, in further embodiments, the bottom die 106 (and not the top die) may have a bond wire 176*a* between the VCCQ pad 108*e* and the CADD #0 pad. Moreover, the bond wire 176*a* may couple the VCCQ pad 108*e* to any of the CADD pads 108*d*** in further embodiments.

Figure 20:
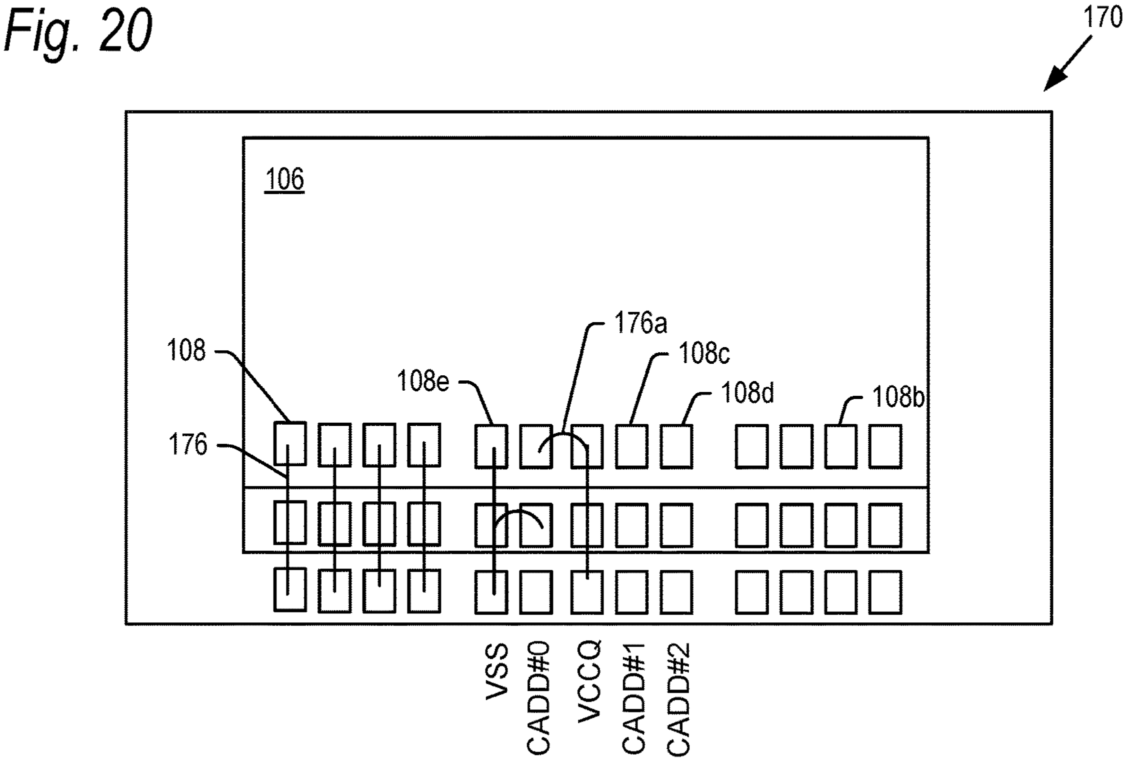
FIG. 20 is a front view of a semiconductor device including semiconductor dies and addressing bond wires fabricated according to further embodiments of the present technology.

It is understood that other voltage pads on the semiconductor dies may be coupled to one or more of the CADD pads **108*d* to provide a voltage to the CADD pads and a unique address to each semiconductor die 106 in semiconductor device 170. One such further embodiment is shown in the top view of FIG. 20. The dies 106 in FIG. 20 are configured with both pull-down and pull-up resistors 140, 142 and trace 148 explained above with respect to FIGS. 8-12. In the embodiment of FIG. 20, one of the dies 106 (e.g., the top die) may have trace 148 coupling the pull-down resistor 140 to a CADD pad 108*d*, and the other of the dies (the bottom die in this example) may have trace 148 coupling the pull-up resistor 142 to the CADD pad 108*d*. Using the dies 106 with the CADD pad 108*d* coupled to pull-down and pull-up resistors 140, 142, respectively, bond wires 176*a* may then be used to couple a CADD pad 108*d* (e.g., pad CADD #0) to the VSS bonding-option pad 108*c* on one of the dies 106. The bond wires 176*a* may also then be used to couple the selected CADD pad (pad CADD #0 in this example) to the VCCQ voltage pad 108*e* on the other of the dies 106. In this way, voltages to the VSS and VCCQ pads 108*c*, 108*e* will assign unique addresses to the top and bottom semiconductor dies, with the top die 106 in FIG. 20 having logic Address 0 and the bottom die 106*d* in FIG. 20** having logic Address 1.

Figure 21:
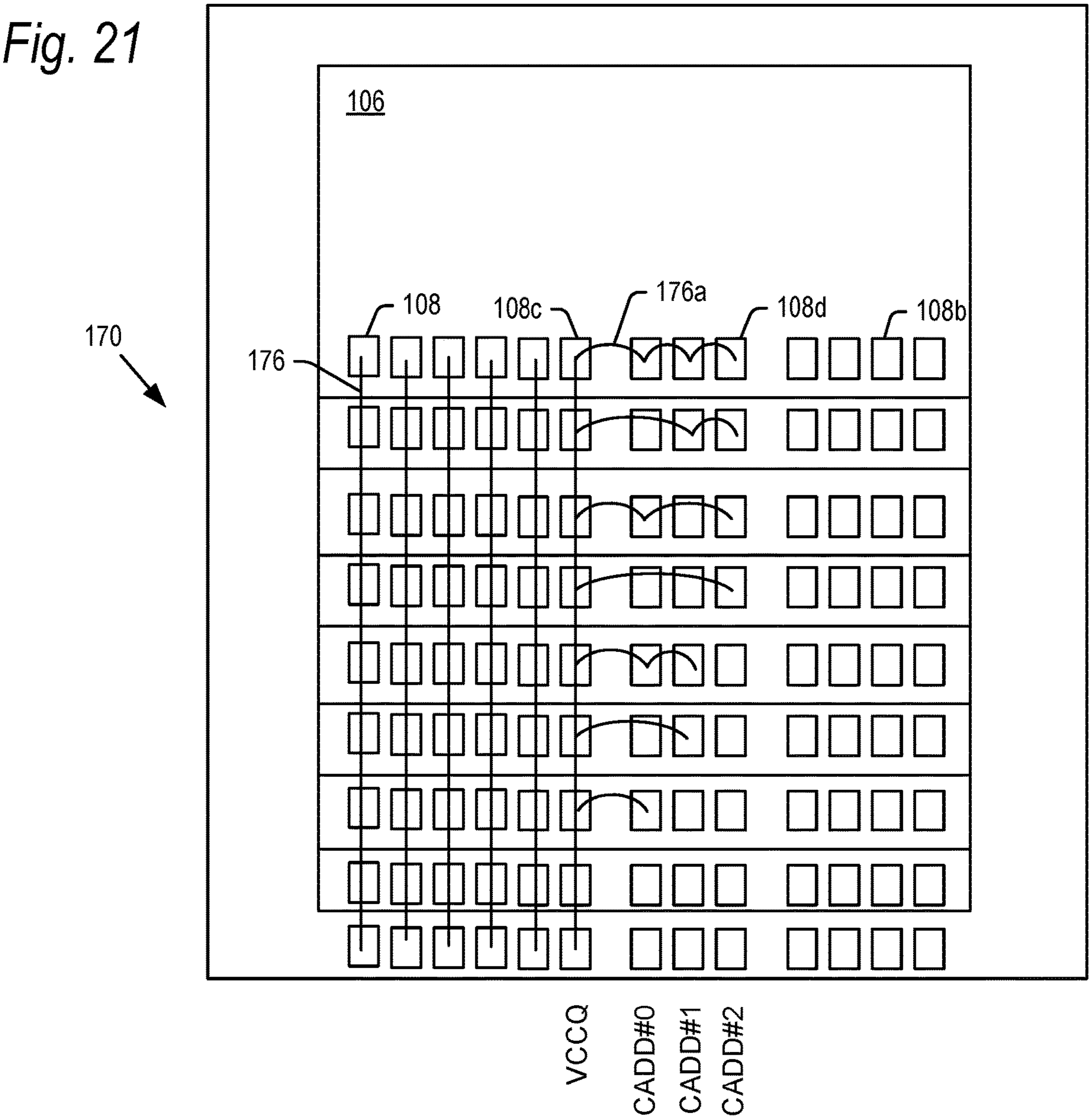
FIG. 21 is a front view of a semiconductor device including semiconductor dies and addressing bond wires fabricated according to still further embodiments of the present technology.

In embodiments described above, the CADD #0 is shown connected to a power source to uniquely address the different semiconductor dies 106 packaged into semiconductor device 170. However, as noted, any of the CADD pads **108*d* may be used. Moreover, more than one CADD pad 108*d*** may be used to uniquely address each semiconductor die in semiconductor devices 170 having more than two semiconductor dies. For example, FIG. 21 is a top view of a semiconductor device 170 including eight semiconductor dies 106. By providing unique connections between the three CADD pads CADD #0, CADD #1 and CADD #2 and a voltage pad VCCQ with bond wires 176*a*, each die may be uniquely addressed. In the illustrated embodiment, the dies have the connections and logic Addresses shown in the following table 1:

TABLE 1

| Die | Connections between VCCQ and CADD pads | Logic Address |
|---|---|---|
| 0 | None | 0 |
| 1 | Connection to CADD#0 | 1 |
| 2 | Connection to CADD#1 | 2 |
| 3 | Connection to CADD#1, CADD#0 | 3 |
| 4 | Connection to CADD#2 | 4 |
| 5 | Connection to CADD#2, CADD#0 | 5 |
| 6 | Connection to CADD#2, CADD#1 | 6 |
| 7 | Connection to CADD#2, CADD#1, CADD#0 | 7 |

Other schemes are contemplated for uniquely addressing large numbers of dies using bond wires 176*a* between voltage pads and different address pads on dies 106.

Figure 22:
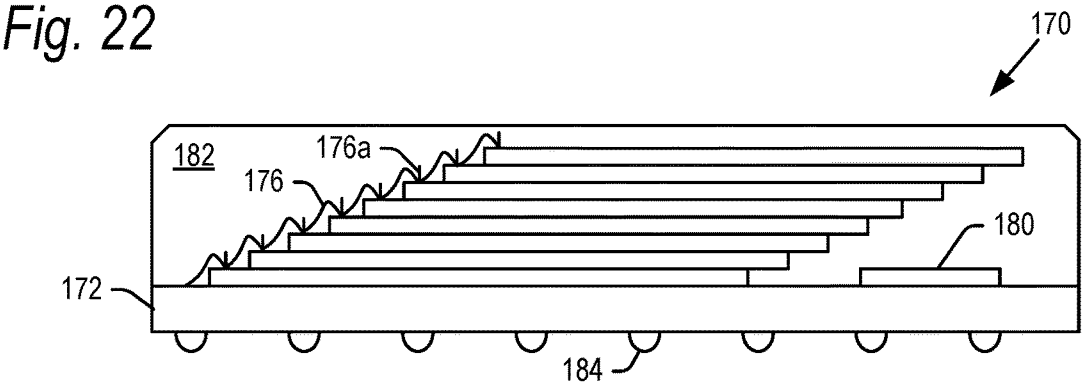
FIG. 22 is an edge view of a finished semiconductor device according to embodiments of the present technology.

FIG. 22 is an edge view of a completed semiconductor device 170 using dies tested and configured according to any of the above-described embodiments. The device 170 is shown with a number of semiconductor dies 106 mounted on substrate 172, and bonded to each other and the substrate 172 using bond wires 176 and addressing bond wires 176*a*. Where semiconductor dies 106 are flash memory dies, a controller die 180, such as an ASIC, may further be mounted to the substrate 172 to control the exchange of data to and from the semiconductor dies 106. In step 230 (FIG. 1), the semiconductor device 170 may be encapsulated in a molding compound 182, which may for example be epoxy resin, Phenol resin, fused silica, crystalline silica, carbon black and/or metal hydroxide. Other molding compounds are contemplated. In embodiments, the semiconductor device 170 may be used as a BGA (ball grid array) package soldered to a host device such as a printed circuit board. In such embodiments, the semiconductor device 170 may further include solder balls 184 on a bottom surface of the substrate 172 for physically and electrically coupling the semiconductor device 170 to the host device.

In embodiments described above, first and second semiconductor dies in a given die pair may be distinguished from each other and uniquely addressed by a bond pad on the first die being coupled to ground while a bond pad on the second die is coupled to a voltage. However, it is understood that, instead of ground, the first and second semiconductor dies in a given die pair may be distinguished from each other and uniquely addressed by a bond pad on the first die being coupled to a first voltage while a bond pad on the second die is coupled to a second voltage that is different than the first voltage.

In embodiments described above, traces 112 are used to electrically couple two semiconductor dies 106 to each other that are vertically adjacent or horizontally adjacent to each other. However, it is understood that the traces 112 may be used to electrically couple two semiconductor dies that are not adjacent to each other in further embodiments. The configuration of test pins, ground pins, power pins, etc. on the probe card would be reconfigured accordingly to mate with non-adjacent semiconductor dies paired by traces 112.

In summary, the present technology relates to a semiconductor wafer configured to be tested by a test assembly comprising a probe card, the semiconductor wafer comprising: a plurality of semiconductor dies, each comprising integrated circuits and a plurality of die bond pads, the plurality of die bond pads on each semiconductor die comprising test pads and at least one voltage pad; a first set of scribe lines oriented along an x-axis between adjacent semiconductor dies of the plurality of semiconductor dies; a second set of scribe lines oriented along a y-axis, orthogonal to the x-axis, between adjacent semiconductor dies of the plurality of semiconductor dies; a plurality of traces extending between the test pads of pairs of semiconductor dies of the plurality of semiconductor dies, the plurality of traces extending into the first and/or second set of scribe lines, and the plurality of traces electrically coupling channels of the test pads of first and second dies of the die pairs together; and a pull-down resistor coupled to ground and the voltage pad on the first semiconductor dies, the first pull-down resistor providing the voltage pad on the first semiconductor dies with a pull down to ground to assign the first semiconductor dies a logical 0 address used to distinguish between the first and second semiconductor dies.

In another example, the present technology relates to a semiconductor die configured to be tested by a test assembly while part of a wafer, the test assembly comprising a probe card, the semiconductor die comprising: integrated circuits; a plurality of die bond pads, the plurality of die bond pads comprising test pads and at least one voltage pad; a plurality of severed traces extending from the test pads, the plurality of severed traces configured to couple the test pads of the semiconductor die with a second set of test pads of a second semiconductor die; and a pull-down resistor coupled to ground, the pull-down resistor configured to pull the semiconductor die to a logical 0 address when the pull-down resistor is coupled to the voltage pad.

In a further example, the present technology relates to a semiconductor wafer configured to be tested by a test assembly comprising a probe card, the semiconductor wafer comprising: a plurality of semiconductor dies, each comprising integrated circuits and a plurality of die bond pads, the plurality of die bond pads on each semiconductor die comprising test pads and at least one voltage pad; a first set of scribe lines oriented along an x-axis between adjacent semiconductor dies of the plurality of semiconductor dies; a second set of scribe lines oriented along a y-axis, orthogonal to the x-axis, between adjacent semiconductor dies of the plurality of semiconductor dies; a plurality of traces extending between the test pads of pairs of semiconductor dies of the plurality of semiconductor dies, the plurality of traces extending into the first and/or second set of scribe lines, and the plurality of traces electrically coupling channels of the test pads of first and second dies of the die pairs together; and means for biasing the voltage pad on the first semiconductor dies to assign the first semiconductor dies a logical 0 address used to distinguish between the first and second semiconductor dies.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor wafer configured to be tested by a test assembly comprising a probe card, the semiconductor wafer comprising:

a plurality of semiconductor dies, each comprising integrated circuits and a plurality of die bond pads, the plurality of die bond pads on each semiconductor die comprising test pads and at least one voltage pad;

a first set of scribe lines oriented along an x-axis between adjacent semiconductor dies of the plurality of semiconductor dies;

a second set of scribe lines oriented along a y-axis, orthogonal to the x-axis, between the adjacent semiconductor dies of the plurality of semiconductor dies;

a plurality of traces extending between the test pads of pairs of semiconductor dies of the plurality of semiconductor dies, the plurality of traces extending into the first and/or second set of scribe lines, and the plurality of traces electrically coupling channels of the test pads of first and second dies of the pairs of semiconductor dies together; and a pull-down resistor coupled to ground and the at least one voltage pad on the first semiconductor dies, the pull-down resistor providing the at least one voltage pad on the first semiconductor dies with a pull down to ground to assign the first semiconductor dies a logical 0 address used to distinguish between the first and second semiconductor dies.

2. The semiconductor wafer of claim 1, wherein the pairs of semiconductor dies are configured to be tested together in a single touch-down of the probe card.

3. The semiconductor wafer of claim 1, wherein the pull-down resistor comprises a first pull-down resistor, the semiconductor wafer further comprising a second pull-down resistor coupled to the at least one voltage pad on the second semiconductor dies, the second pull-down resistor providing the at least one voltage pad on the second semiconductor dies with a pull down to ground, wherein the at least one voltage pad on the second semiconductor dies is configured to mate with a power pin on the probe card to assign the second semiconductor dies a logical 1 address used to distinguish between the first and second semiconductor dies.

4. The semiconductor wafer of claim 1, wherein at least one voltage pad comprises a core addressing pad.

5. The semiconductor wafer of claim 1, wherein the semiconductor dies within the pairs of semiconductor dies are horizontally oriented along the x-axis with respect to each other.

6. The semiconductor wafer of claim 1, wherein the semiconductor dies within the pairs of semiconductor dies are vertically oriented along the y-axis with respect to each other.

7. The semiconductor wafer of claim 1, wherein the plurality of traces are formed within a major surface of the semiconductor wafer.

8. The semiconductor wafer of claim 1, wherein the plurality of traces are formed on top of a major surface of the semiconductor wafer.

9. The semiconductor wafer of claim 1, wherein the plurality of test pads on the first semiconductor die receive test pins thereon for testing the first semiconductor die by the test assembly.

10. The semiconductor wafer of claim 1, wherein the plurality of test pads on the first semiconductor die do not receive test pins thereon during testing of the first semiconductor die by the test assembly.

11. A semiconductor wafer configured to be tested by a test assembly comprising a probe card, the semiconductor wafer comprising:

a plurality of semiconductor dies, each comprising integrated circuits and a plurality of die bond pads, the plurality of die bond pads on each semiconductor die comprising test pads and at least one voltage pad;

a first set of scribe lines oriented along an x-axis between adjacent semiconductor dies of the plurality of semiconductor dies;

a second set of scribe lines oriented along a y-axis, orthogonal to the x-axis, between the adjacent semiconductor dies of the plurality of semiconductor dies;

a plurality of traces extending between the test pads of pairs of semiconductor dies of the plurality of semiconductor dies, the plurality of traces extending into the first and/or second set of scribe lines, and the plurality of traces electrically coupling channels of the test pads of first and second semiconductor dies of the pairs of semiconductor dies together; and means for biasing the at least one voltage pad on the first semiconductor dies to assign the first semiconductor dies a logical 0 address used to distinguish between the first and second semiconductor dies.

* * * * *